United States Patent
Kanno

(10) Patent No.: US 11,176,032 B2
(45) Date of Patent: Nov. 16, 2021

(54) MEMORY SYSTEM AND METHOD OF CONTROLLING NONVOLATILE MEMORY

(71) Applicant: Kioxia Corporation, Minato-ku (JP)

(72) Inventor: Shinichi Kanno, Ota (JP)

(73) Assignee: Kioxia Corporation, Minato-ku (JP)

(*) Notice: Subject to any disclaimer, the term of this patent is extended or adjusted under 35 U.S.C. 154(b) by 62 days.

(21) Appl. No.: 16/815,894

(22) Filed: Mar. 11, 2020

(65) Prior Publication Data

US 2021/0064520 A1 Mar. 4, 2021

(30) Foreign Application Priority Data

Aug. 28, 2019 (JP) .............................. JP2019-155834

(51) Int. Cl.
| | |
|---|---|
| *G06F 12/02* | (2006.01) |
| *G06F 12/1009* | (2016.01) |
| *G11C 16/26* | (2006.01) |
| *G11C 16/08* | (2006.01) |
| *G06F 13/16* | (2006.01) |

(52) U.S. Cl.
CPC ...... *G06F 12/0246* (2013.01); *G06F 12/1009* (2013.01); *G06F 13/1673* (2013.01); *G11C 16/08* (2013.01); *G11C 16/26* (2013.01); *G06F 2212/7201* (2013.01)

(58) Field of Classification Search
None
See application file for complete search history.

(56) References Cited

U.S. PATENT DOCUMENTS

| | | | | |
|---|---|---|---|---|
| 8,856,468 | B2* | 10/2014 | Fukuda | G06F 12/0246 711/156 |
| 9,977,611 | B2* | 5/2018 | Sekido | G06F 3/0608 |
| 10,725,690 | B2* | 7/2020 | Radtke | G06F 3/0679 |
| 2016/0019160 | A1* | 1/2016 | Mohan | G06F 12/0246 711/208 |
| 2016/0048328 | A1 | 2/2016 | Kitsunai | |
| 2016/0154594 | A1* | 6/2016 | Kang | G06F 3/0688 711/103 |
| 2017/0147499 | A1* | 5/2017 | Mohan | G06F 12/10 |
| 2017/0168951 | A1 | 6/2017 | Kanno | |
| 2017/0344287 | A1 | 11/2017 | Tomlin et al. | |

* cited by examiner

*Primary Examiner* — Elias Mamo
(74) *Attorney, Agent, or Firm* — Oblon, McClelland, Maier & Neustadt, L.L.P.

(57) ABSTRACT

According to one embodiment, a memory system includes a nonvolatile memory and a controller. In response to receiving a first write command from a host, the controller determines a first physical address indicative of a physical storage location of the nonvolatile memory to which first write data associated with the first write command is to be written, and updates an address translation table such that the first physical address is associated with a logical address of the first write data. The controller starts updating the address translation table before the transfer of the first write data is finished or before the write of the first write data to the nonvolatile memory is finished.

12 Claims, 20 Drawing Sheets

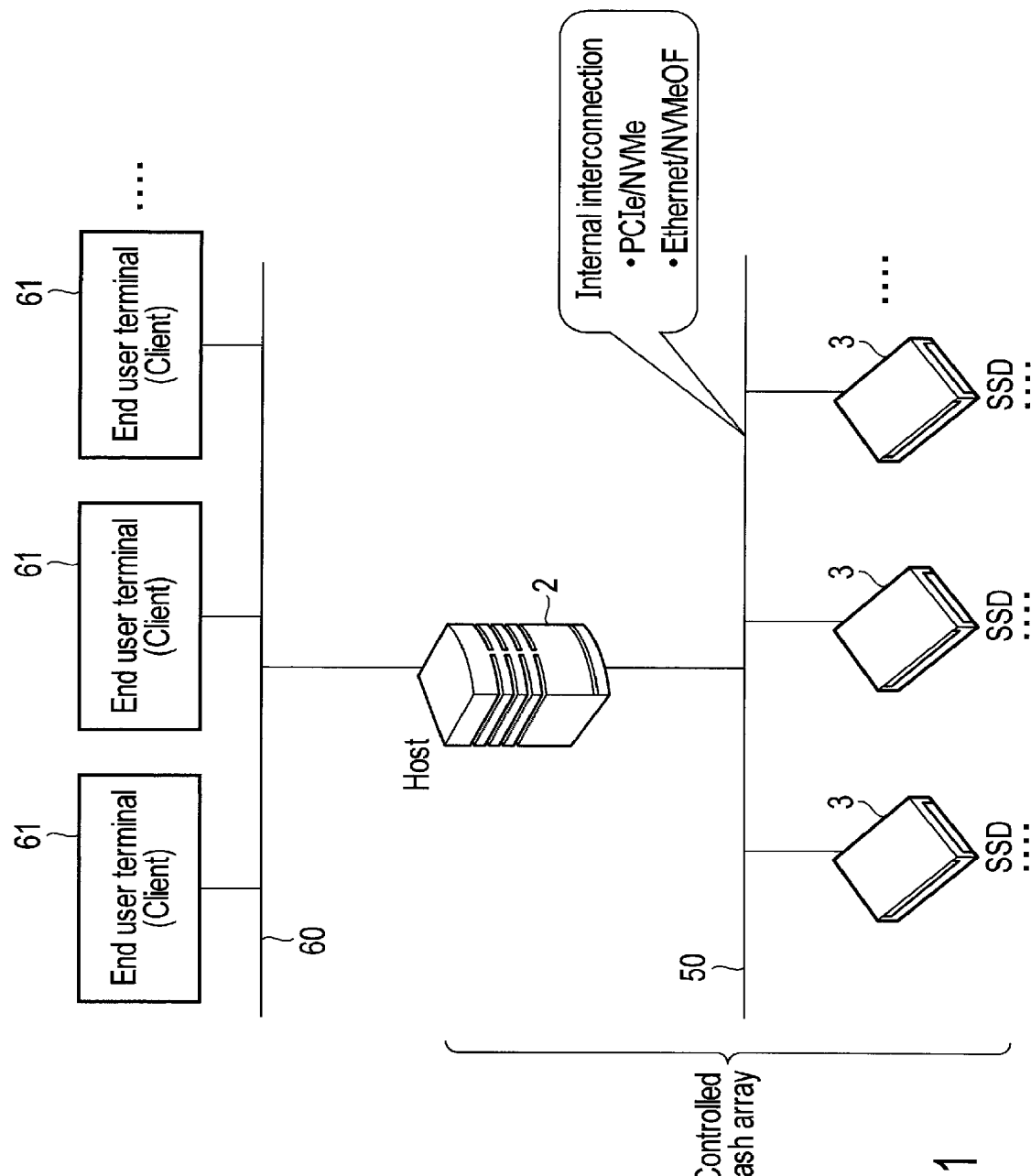
F I G. 1

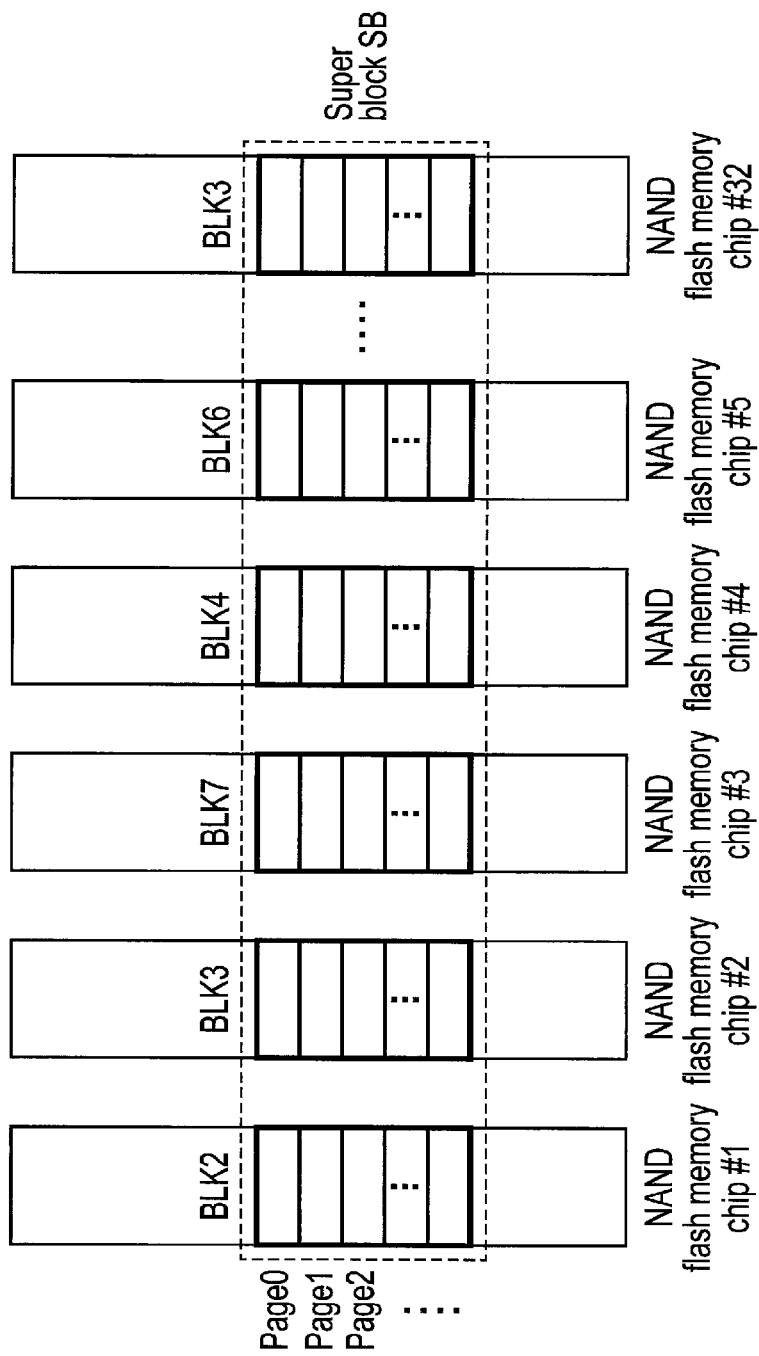
F I G. 4

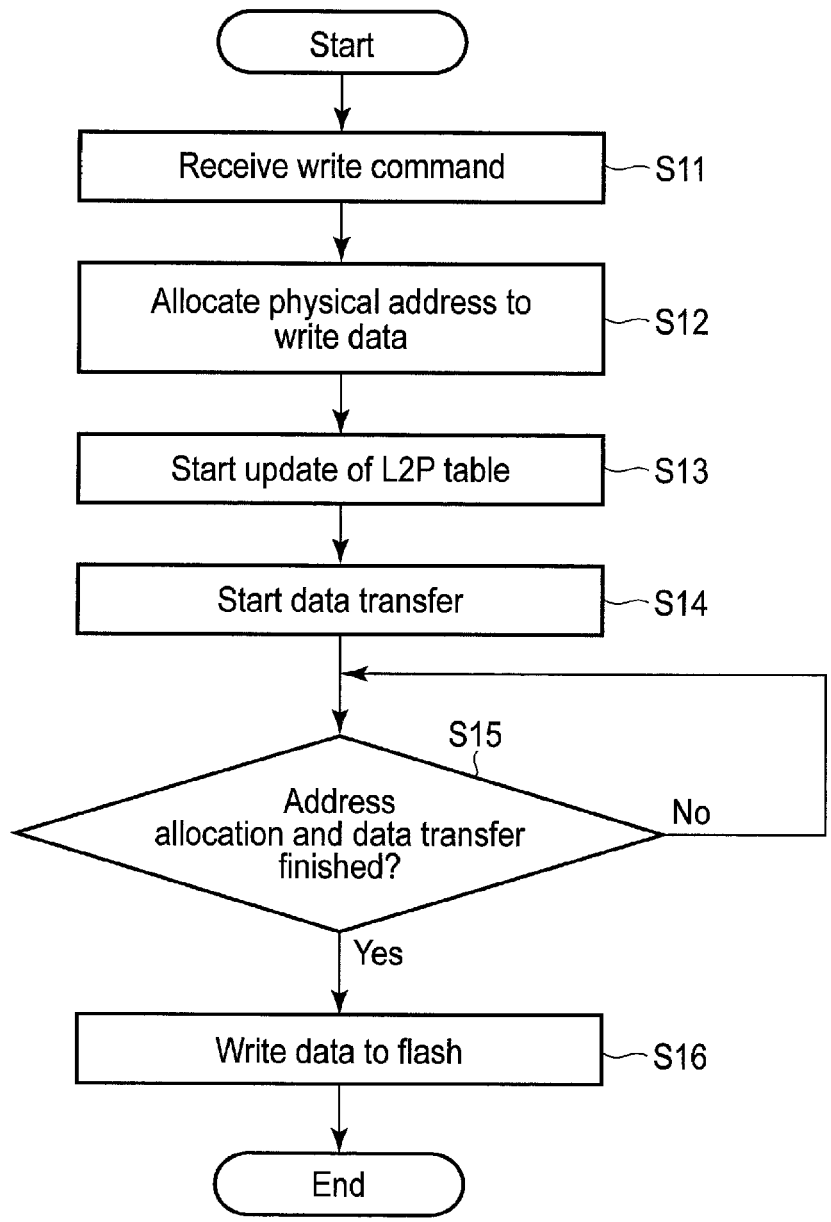
F I G. 7

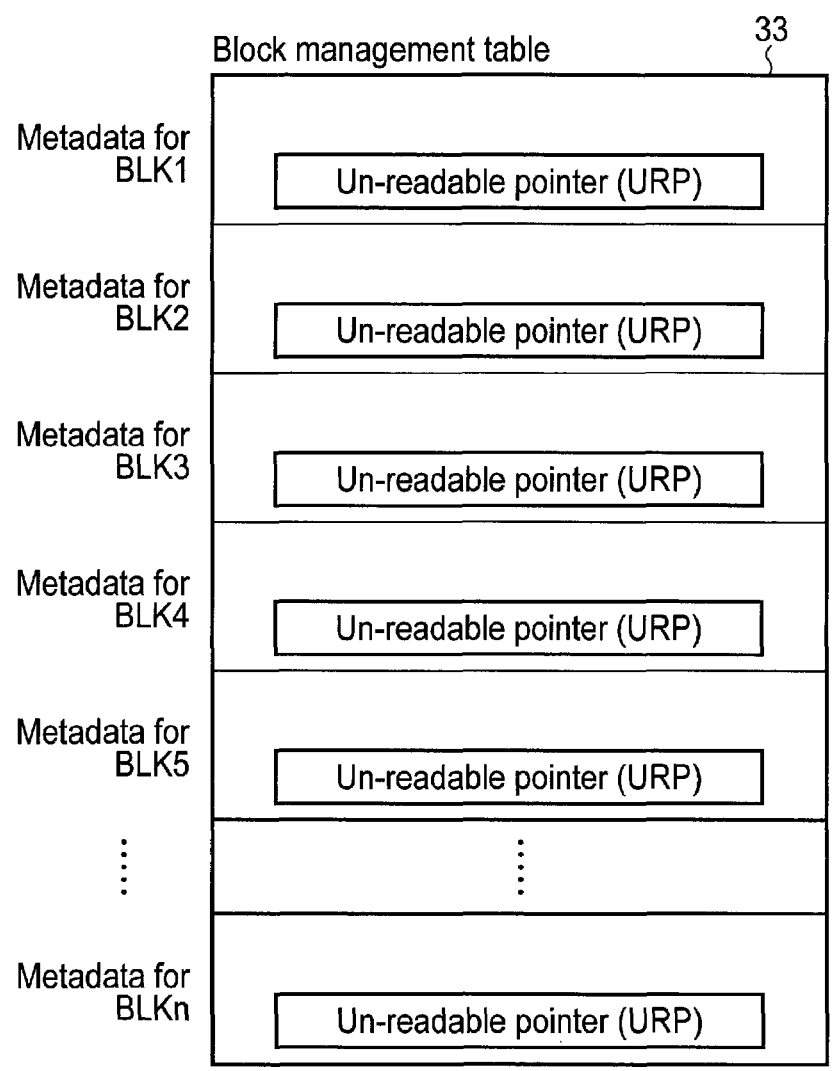
F I G. 8

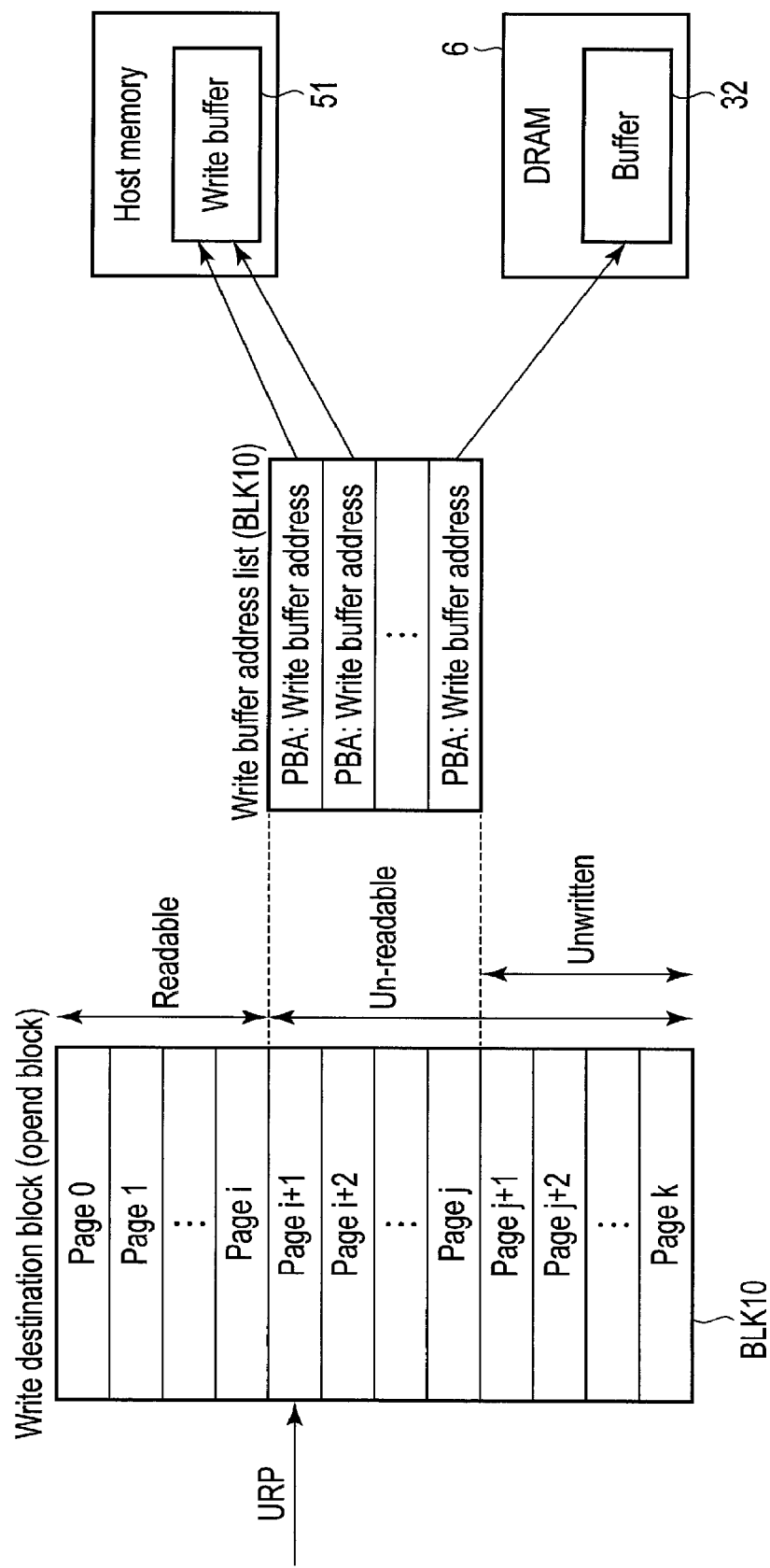
F I G. 12

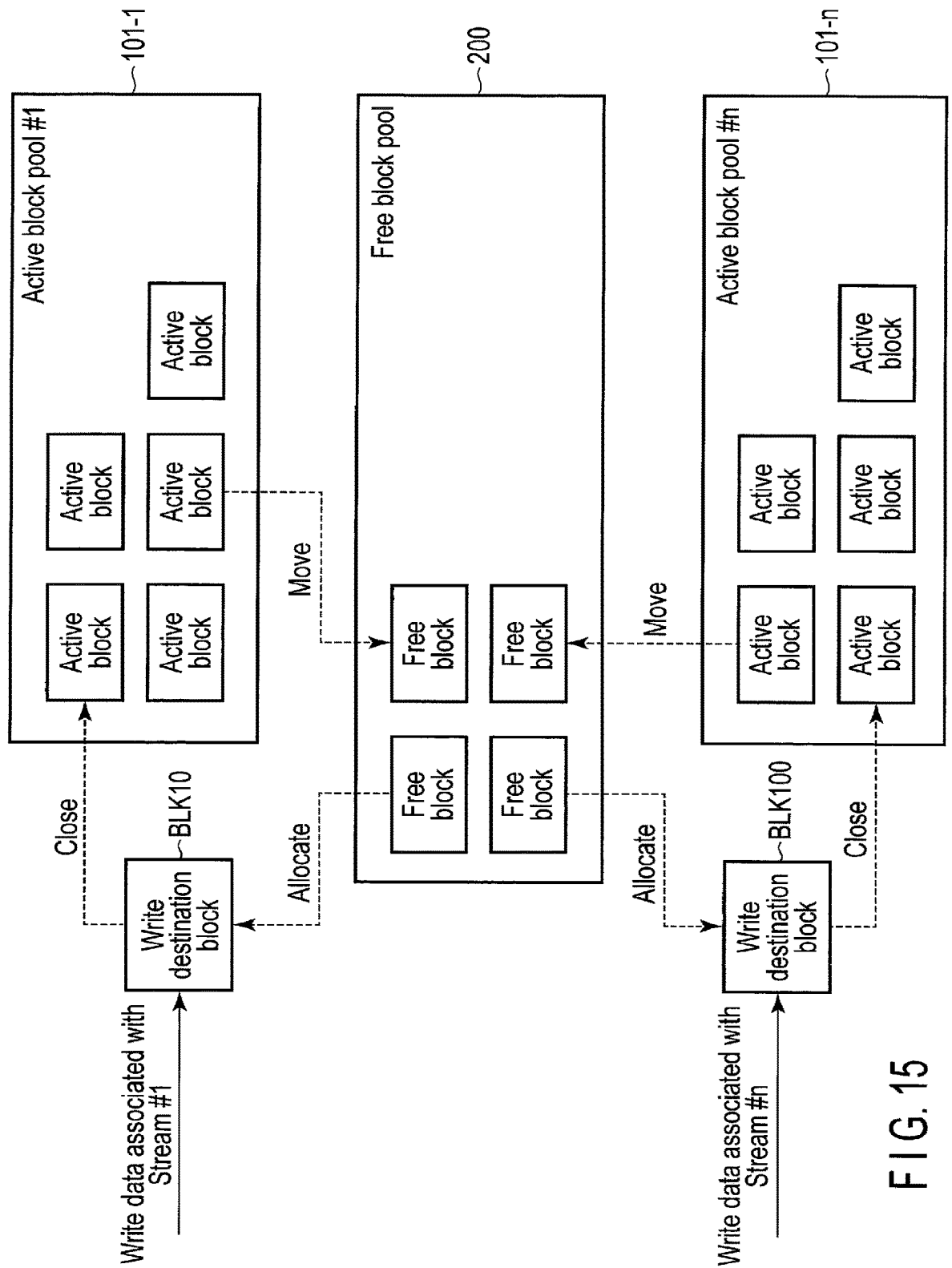
F I G. 15

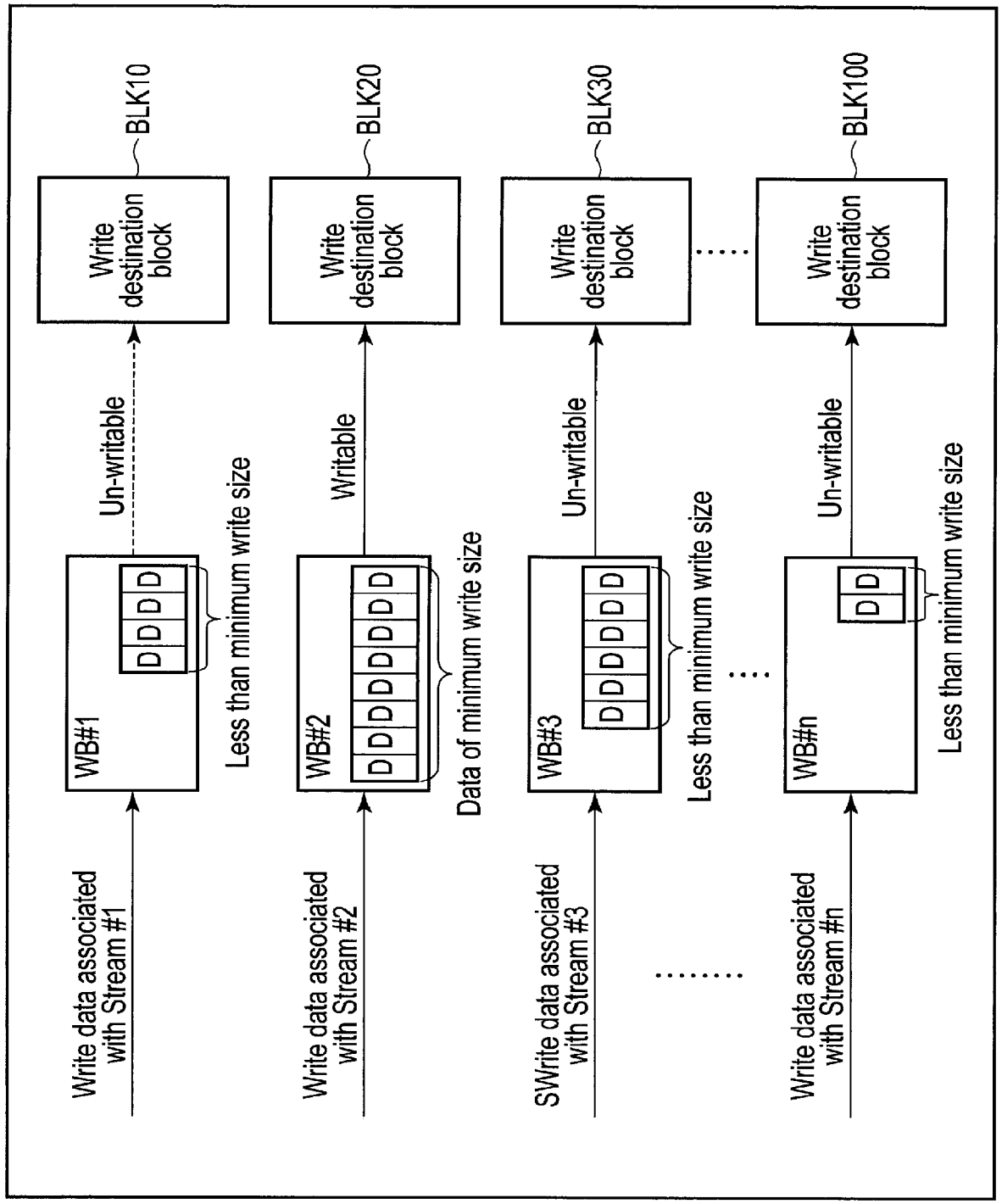
F I G. 16

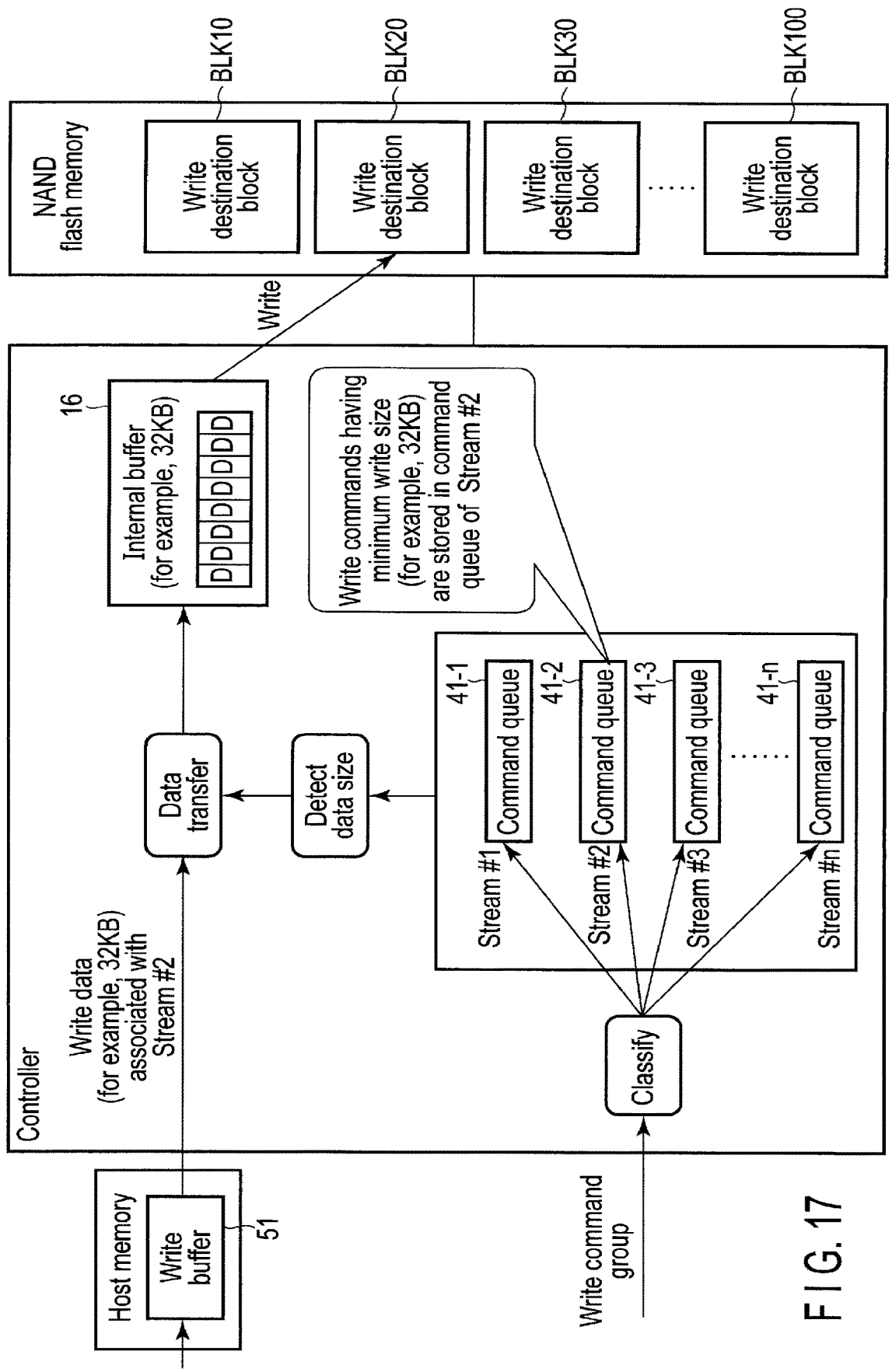
F I G. 17

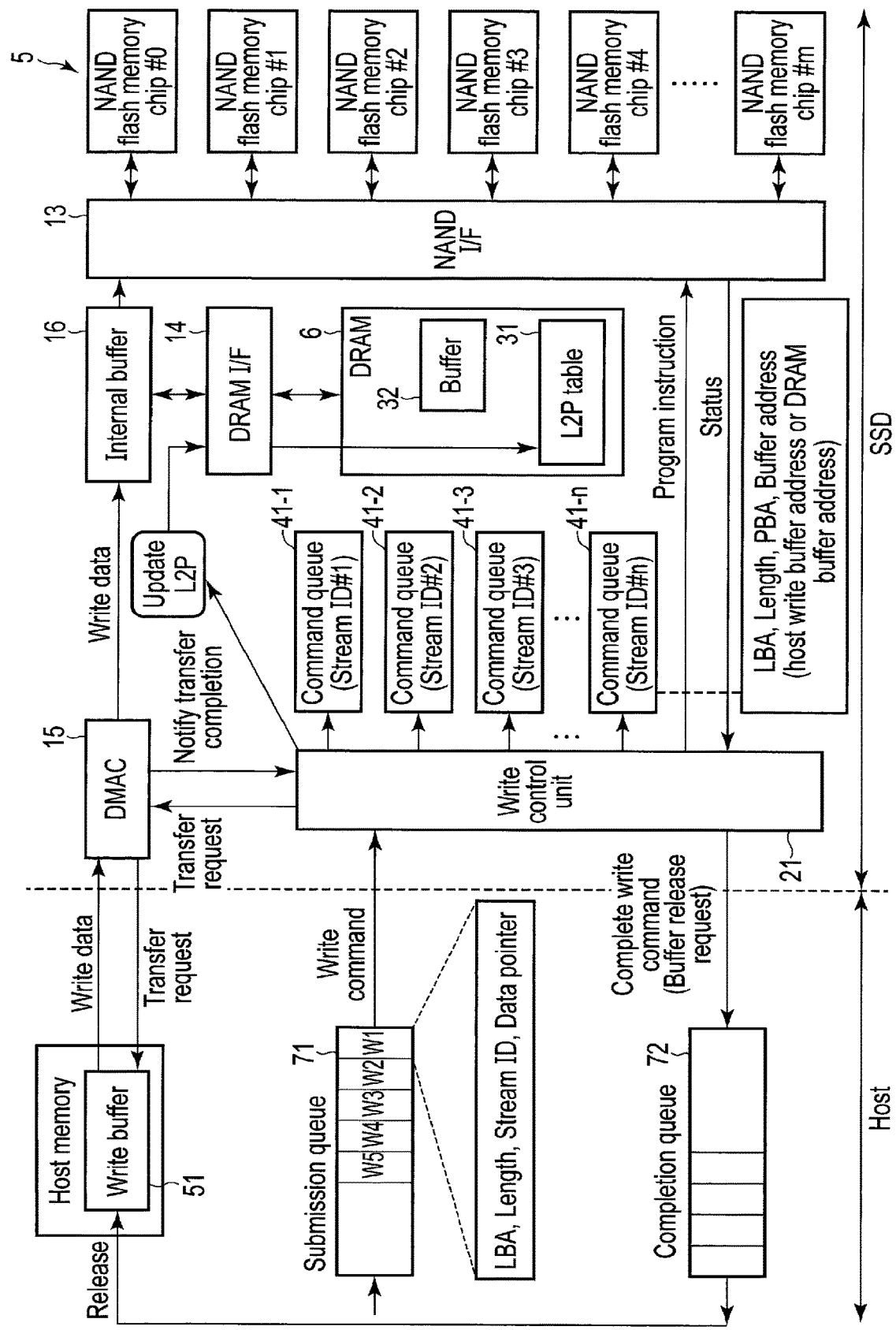
F I G. 18

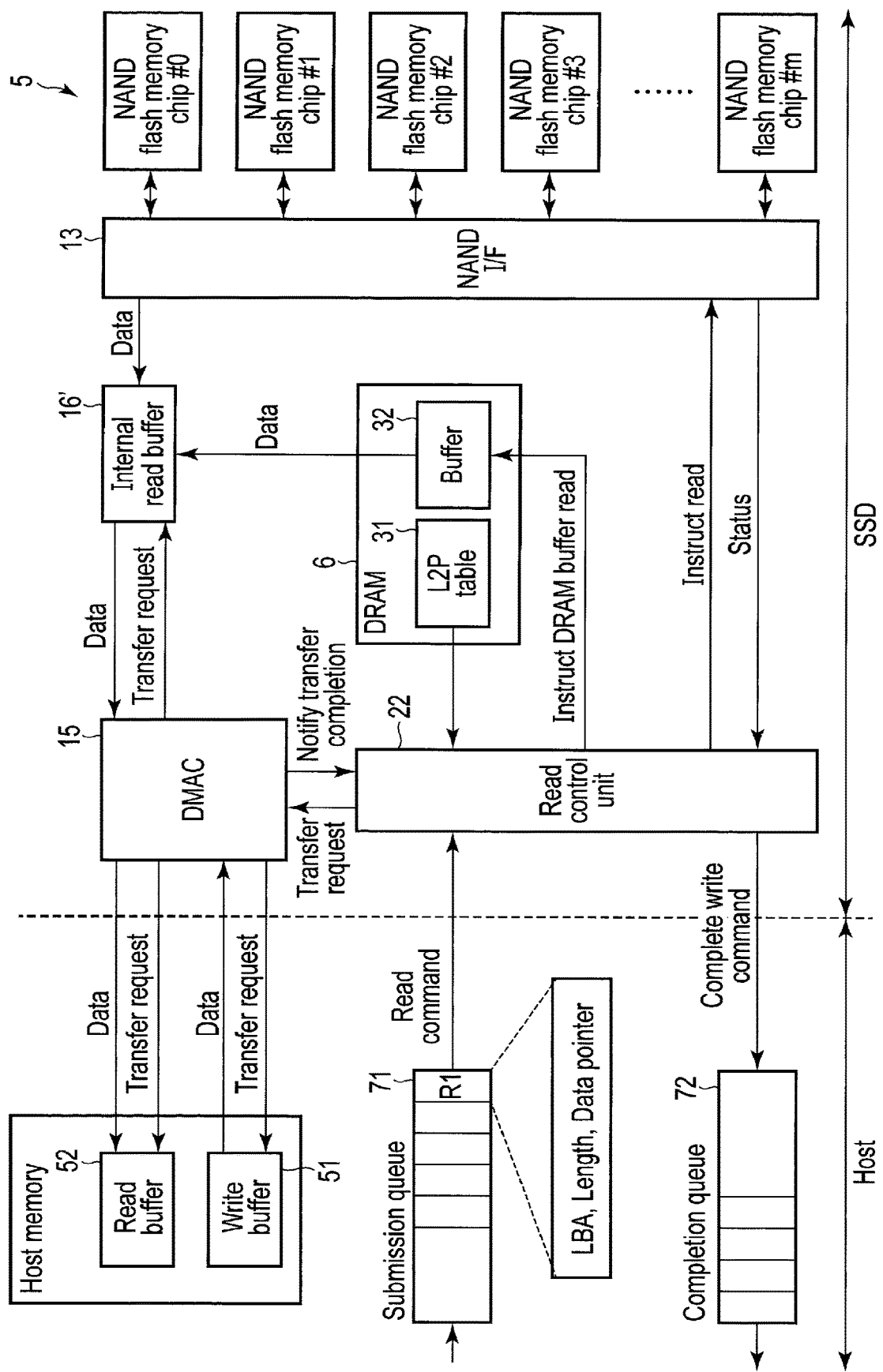
F I G. 19

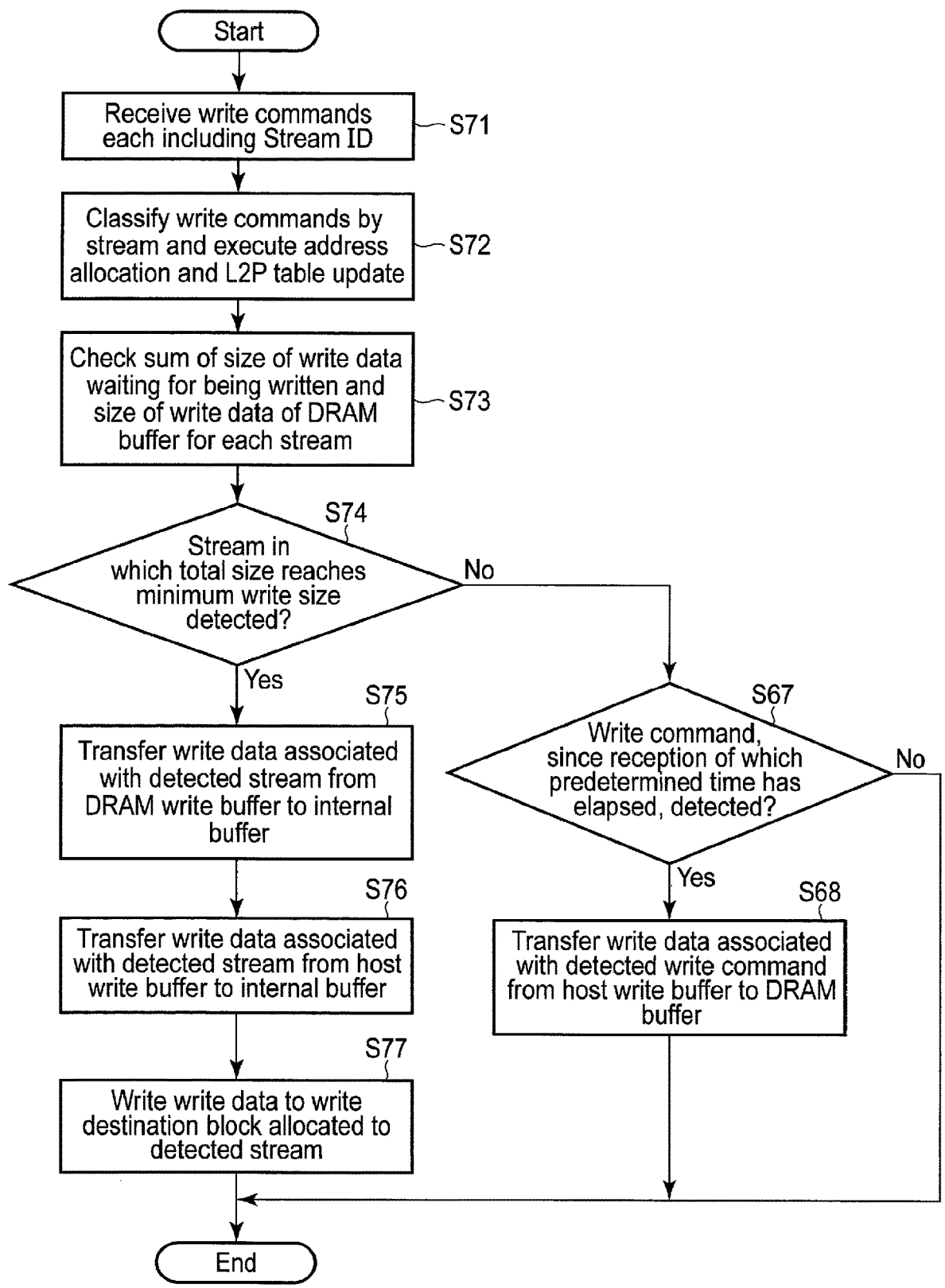
F I G. 21

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2019-155834, filed Aug. 28, 2019, the entire contents of which are incorporated herein by reference.

FIELD

Embodiments described herein relate generally to a technology of controlling a nonvolatile memory.

BACKGROUND

In recent years, memory systems comprising nonvolatile memories have been widely prevalent. As such a memory system, a solid state drive (SSD) based on a NAND flash technology is known.

The SSD are used as storage devices of various host computing systems such as data center servers.

In the storage device used in the host computing system, improvement of its performance is required.

BRIEF DESCRIPTION OF THE DRAWINGS

FIG. 1 is a block diagram illustrating a relationship between a host and a memory system according to an embodiment.

FIG. 4 is a diagram illustrating a configuration example of a super block used in the memory system according to the embodiment.

FIG. 7 is a flowchart illustrating a procedure of a write operation executed in the memory system according to the embodiment.

FIG. 8 is a diagram illustrating an example of a data structure of a block management table used in the memory system according to the embodiment.

FIG. 12 is a block diagram illustrating an example of a write buffer address list in the write destination block management table.

FIG. 15 is a block diagram illustrating an operation which allocates the plurality of write destination blocks corresponding to the plurality of streams, from a group of free blocks.

FIG. 16 is a block diagram illustrating a write operation executed by using a plurality of buffer areas corresponding to the plurality of streams.

FIG. 17 is a block diagram illustrating a write operation executed in the memory system according to the embodiment.

FIG. 18 is a block diagram illustrating configuration examples of the host and the memory system according to the embodiment in relation to data write.

FIG. 19 is a block diagram illustrating configuration examples of the host and the memory system according to the embodiment in relation to data read.

FIG. 21 is a flowchart illustrating another procedure of a write operation executed in the memory system according to the embodiment.

DETAILED DESCRIPTION

Figure 2:
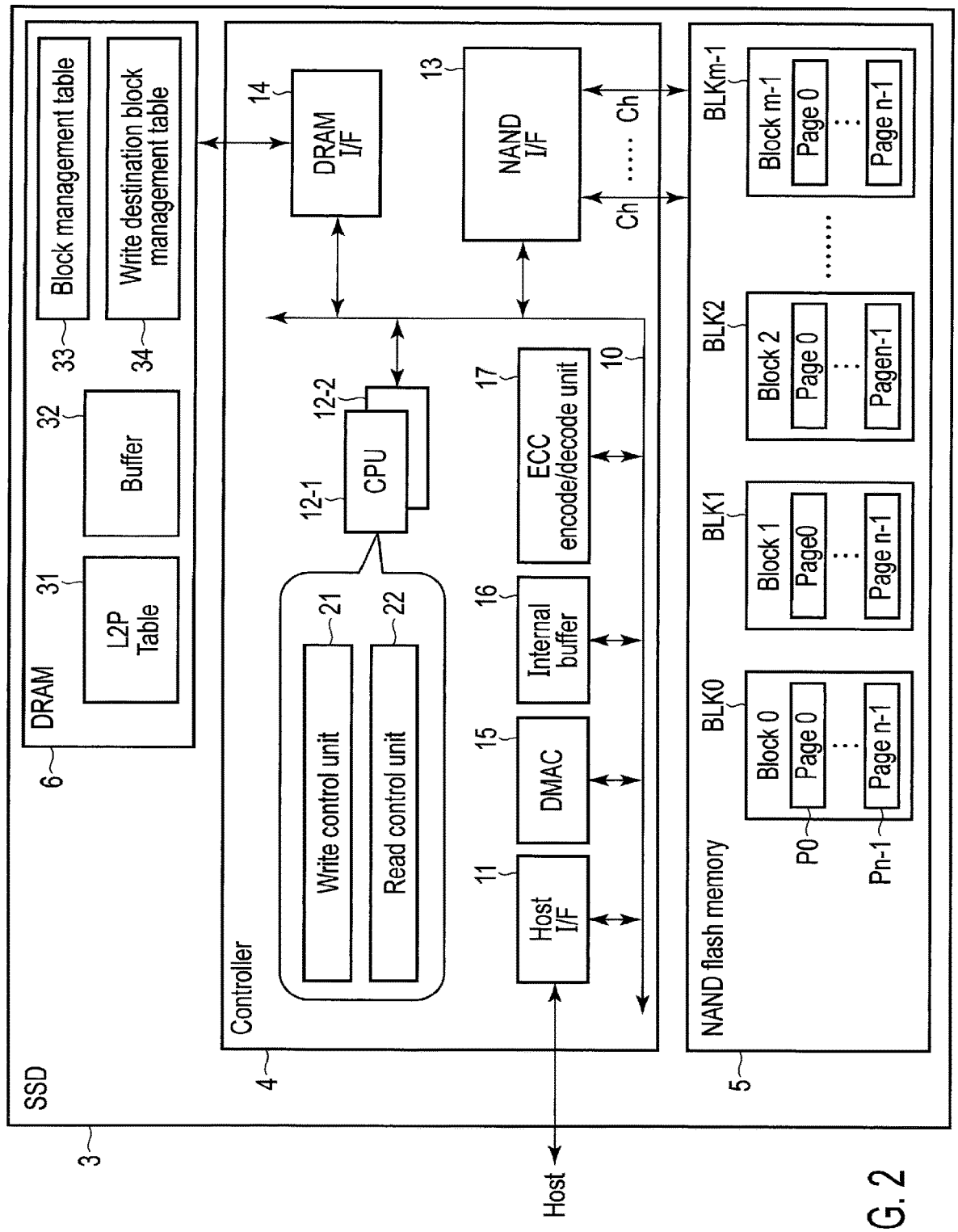
FIG. 2 is a block diagram illustrating a configuration example of the memory system of the embodiment.

Various embodiments will be described hereinafter with reference to the accompanying drawings.

In general, according to one embodiment, a memory system connectable to a host, comprises a nonvolatile memory including a plurality of blocks each including a plurality of pages, and a controller electrically connected to the nonvolatile memory and configured to control the nonvolatile memory. In response to receiving a first write command from the host, the controller determines a first physical address indicative of a physical storage location of the nonvolatile memory to which first write data associated with the first write command is to be written, and updates an address translation table such that the first physical address is associated with a logical address of the first write data. The controller transfers the first write data from a write buffer in a memory of the host to the controller, and writes the first write data to a write destination location in the first write destination block of the nonvolatile memory, which is designated by the first physical address. The controller starts updating the address translation table before the transfer of the first write data is finished or before the write of the first write data to the nonvolatile memory is finished.

FIG. 1 is a block diagram illustrating a relationship between a host and a memory system according to the embodiment.

This memory system is a semiconductor storage device configured to write data to a nonvolatile memory and to read data from the nonvolatile memory. The memory system is implemented as a solid-state drive (SSD) 3 based on the NAND flash technology.

A host (i.e., host device) 2 is configured to control a plurality of SSDs 3. The host 2 is implemented by an information processing apparatus configured to use a flash array including the SSDs 3 as storage. This information processing apparatus may be a personal computer or a server computer.

The SSD 3 may be used as one of a plurality of storage devices provided in a storage array. The storage array may be connected to the information processing apparatus such as a server computer via a cable or a network. The storage array comprises a controller which controls a plurality of storages (for example, a plurality of SSDs 3) in the storage array. When the SSD 3 is applied to the storage array, the controller of the storage array may function as a host of the SSD 3.

An example that the information processing apparatus such as a server computer functions as the host 2 will be described below.

The host (i.e., server) 2 and the plurality of SSD 3 are interconnected via an interface 50 (i.e., internal interconnection). The interface 50 for the interconnection is not limited to this, but PCI Express (PCIe) (registered trademark), NVM Express (NVMe) (registered trademark), Ethernet (registered trademark), NVMe over Fabrics (NVMeOF), and the like can be used as the interface 50 for the interconnection.

A typical example of the server computer which functions as the host 2 is a server computer (hereinafter referred to as a server) in a data center.

In a case where the host 2 is implemented by the server in the data center, the host (i.e., server) 2 may be connected to a plurality of end user terminals (i.e., clients) 61 via a network 60. The host 2 can provide various services to the end user terminals 61.

Examples of services which can be provided by the host (server) 2 are (1) Platform as a Service (PaaS) which provides a system running platform to each client (i.e., each end user terminal 61), (2) Infrastructure as a Service (IaaS) which provides an infrastructure such as a virtual server to each client (i.e., each end user terminal 61), and the like.

A plurality of virtual machines may be executed on a physical server which functions as the host (i.e., server) 2. Each of the virtual machines running on the host (i.e., server) 2 can function as a virtual server configured to provide various services to the client (i.e., end user terminal 61) corresponding to the virtual machine. In each virtual machine, an operating system and a user application that are used by the corresponding end user terminal 61 are executed. The operating system corresponding to each virtual machine includes an I/O service. The I/O service may be a block I/O service based on a logical block address (LBA) or a key-value store service.

In the operating system corresponding to each virtual machine, the I/O service issues I/O commands (i.e., write commands and read commands) in response to a write/read request from the user application. The I/O commands are input to a submission queue in the host 2 and sent to the SSD 3 via the submission queue.

The SSD 3 includes a nonvolatile memory such as a NAND flash memory. The SSD 3 can execute data write to each of a plurality of write destination blocks allocated from a plurality of blocks of the nonvolatile memory. The write destination blocks are indicative of the blocks to which data are to be written.

The SSD 3 supports stream write of writing a plurality of types of write data associated with different streams to different write destination blocks, respectively. In the case of executing the stream write, each of the write commands sent from the host 2 to the SSD 3 includes a stream identifier (stream ID) indicative of one of a plurality of streams. When the SSD 3 receives the write command including the stream ID of a certain stream from the host 2, the SSD 3 writes the write data associated with the write command to the write destination block corresponding to the stream. When the SSD 3 receives the write command including the stream ID of the other stream from the host 2, the SSD 3 writes the write data associated with the write command to the other write destination block corresponding to the other stream. When the overall write destination block corresponding to the certain stream is filled with the data, a new write destination block for this stream is allocated.

Therefore, the host 2 can implement the data placement that, by issuing the write commands each including the stream ID for the SSD 3, for example, a group of specific data such as data of a user application corresponding to a certain end user terminal 61 (i.e., client) is written to one or more specific blocks, and a group of the other specific data such as data of a user application corresponding to the other end user terminal 61 (i.e., client) is written to one or more other blocks.

FIG. 2 illustrates a configuration example of the SSD 3.

The SSD 3 comprises a controller 4 and a nonvolatile memory (i.e., NAND flash memory) 5. The SSD 3 may comprise a random access memory, for example, a DRAM 6.

The NAND flash memory 5 comprises a memory cell array including a plurality of memory cells arrayed in a matrix. The NAND flash memory 5 may be a NAND flash memory of a two-dimensional structure or a NAND flash memory of a three-dimensional structure.

The memory cell array of the NAND flash memory 5 includes a plurality of blocks BLK0 to BLKm−1. Each of the blocks BLK0 to BLKm−1 includes a plurality of pages (in this example, pages P0 to Pn−1). The blocks BLK0 to BLKm−1 function as erase units. Blocks may also be referred to as erase blocks, physical blocks or physical erase blocks. The pages P0 to Pn−1 are units for a data write operation and a data read operation.

The controller 4 is electrically connected to the NAND flash memory 5 that is a nonvolatile memory via a NAND interface 13 such as Toggle NAND flash interface or Open NAND Flash Interface (ONFI). The controller 4 operates as a memory controller configured to control the NAND flash memory 5. The controller 4 may be implemented by a circuit such as a System-on-a-chip (SoC).

Figure 3:
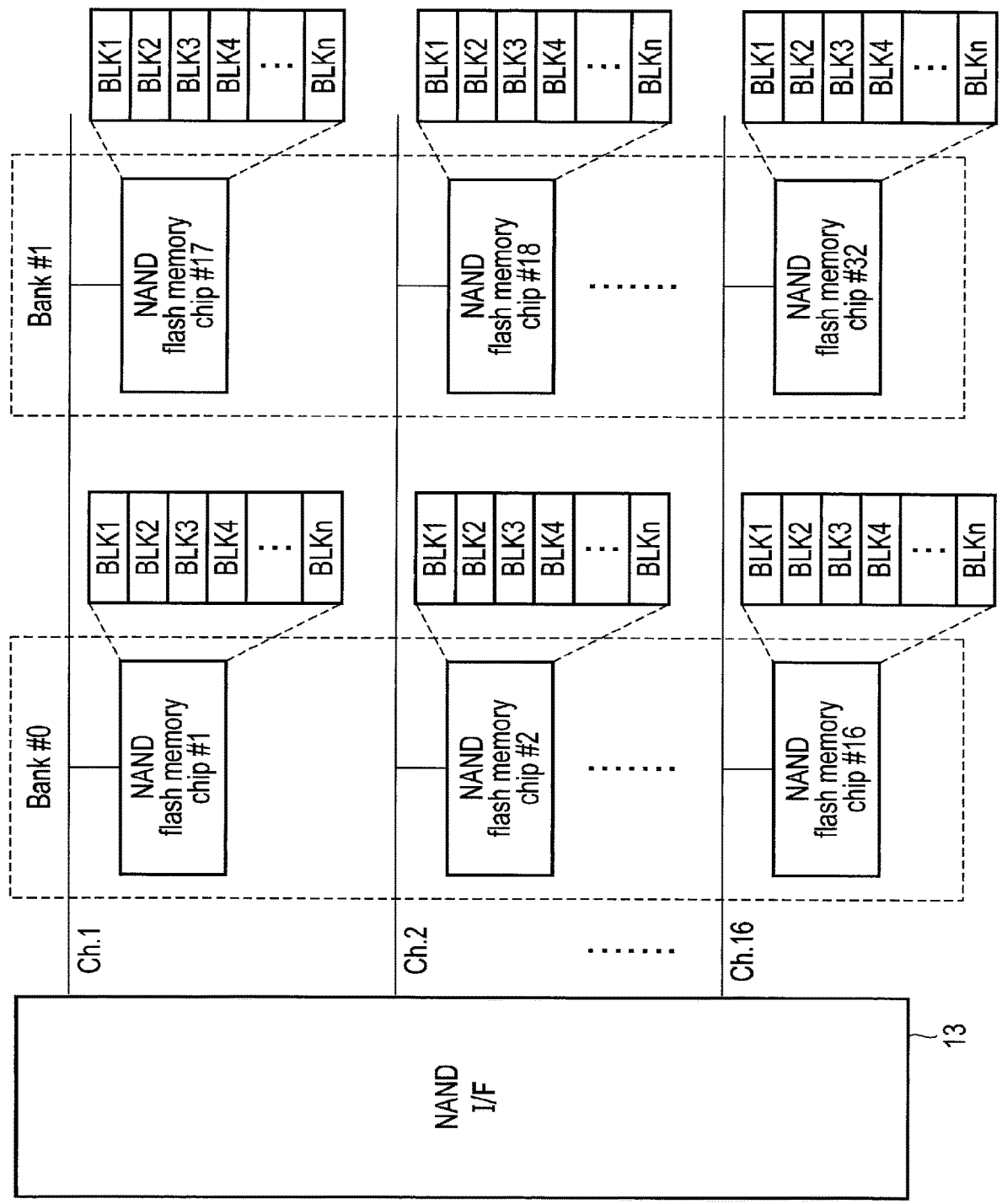
FIG. 3 is a block diagram illustrating a relationship between a plurality of channels and a plurality of NAND flash memory chips, which are used in the memory system according to the embodiment.

As illustrated in FIG. 3, the NAND flash memory 5 may include a plurality of NAND flash memory chips (i.e., NAND flash memory dies). Each of the NAND flash memory chips is operable independently. For this reason, the NAND flash memory chips function as units possible parallel operations.

FIG. 3 illustrates an example in which sixteen channels Ch.1 to Ch.16 are connected to the NAND interface 13, and two NAND flash memory chips are connected to each of sixteen channels Ch.1 to Ch.16. In this case, sixteen NAND flash memory chips #1 to #16 connected to channels Ch.1 to Ch.16 may be organized as bank #0, and the remaining sixteen NAND flash memory chips #17 to #32 connected to channels Ch.1 to Ch.16 may be organized as bank #1. The banks function as units for allowing a plurality of memory modules to execute operations in parallel by bank interleaving. In the configuration example of FIG. 3, a maximum of 32 NAND flash memory chips can be operated in parallel by sixteen channels and bank interleaving of two banks.

An erase operation may be executed in units of single block (i.e., physical block) or in units of parallel unit (i.e., super block) including a set of plural physical blocks capable of parallel operation. One single parallel unit, i.e., one single super block including a set of physical blocks are not limited to this, but may include a total of thirty-two physical blocks selected one by one from NAND flash memory chips #1 to #32. Each of NAND flash memory chips #1 to #32 may have a multi-plane configuration. For example, when each of NAND flash memory chips #1 to #32 comprises a multi-plane structure including two planes, each super block may include sixty-four physical blocks selected one by one from sixty-four planes corresponding to NAND flash memory chips #1 to #32.

FIG. 4 illustrates an example of one super block (SB) including thirty-two physical blocks (in this case, a physical block BLK2 in the NAND flash memory chip #1, a physical block BLK3 in the NAND flash memory chip #2, a physical block BLK7 in the NAND flash memory chip #3, a physical block BLK4 in the NAND flash memory chip #4, a physical block BLK6 in the NAND flash memory chip #5, . . . , and a physical block BLK3 in the NAND flash memory chip #32).

The write destination block may be a single physical block or a single super block. Each super block may include only one physical block and, in this case, a single super block is equivalent to a single physical block.

Next, the configuration of the controller 4 illustrated in FIG. 2 will be described.

The controller 4 can function as a flash translation layer (FTL) configured to execute data management and block management of the NAND flash memory 5. The data management executed by the FTL includes (1) management of mapping information indicating correspondences between logical addresses and physical addresses of the NAND flash memory 5, (2) process for concealing restrictions of the NAND flash memory 5 (for example, read/write operations in units of pages and an erase operation in units of blocks), and the like. The logical address is an address used by the host 2 to designate an address of the location in the logical address space. As the logical address, a logical block address (addressing) (LBA) can be used.

The management of mapping between each of the logical addresses used by the host 2 to access the SSD 3 and each of the physical addresses of the NAND flash memory 5 is executed by using an address translation table (i.e., a logical-to-physical address translation table: L2P table) 31. The controller 4 manages mapping between the logical addresses and the physical addresses in units of predetermined management sizes, by using the L2P table 8. A physical address corresponding to a certain logical address indicates the latest physical storage location to which the data of the logical address is written in the NAND flash memory 5. The L2P table 31 may be loaded from the NAND flash memory 5 into the DRAM 6 at power-on of the SSD 3.

In the NAND flash memory 5, data write to pages can be executed only once per erase cycle. That is, new data cannot be written directly in the region of the block in which some data is already written. For this reason, to update the already written data, the controller 4 writes new data to an unwritten area in the block (or the other block), and handles the previous data as invalid data. In other words, the controller 4 writes the updating data corresponding to one logical address not into the physical storage location where the previous data is stored corresponding to this logical address, but into another physical storage position. Then, the controller 4 associates the logical address with the other physical storage location by updating the L2P table 31, and invalidates the previous data.

In the present embodiment, update of the L2P table 31 (i.e., L2P update) is not executed after data to be written (write data) is written to the NAND flash memory 5, but executed in parallel to transfer of the write data from the host 2 to the SSD 3 or the write of the write data to the NAND flash memory 5. In a case where the L2P update is executed after the write to the NAND flash memory 5 (i.e., flash write), the time necessary for the L2P update directly affects the write performance. This is because, in general, until the L2P update with respect to a certain write command is finished, the operation of allocating a physical address to the write data associated with a next write command cannot be started. Therefore, a high calculation performance enabling the L2P update to be executed at a high speed is considered necessary to prevent degradation of the write performance. In the present embodiment, since the L2P update is executed on a background of a process (i.e., data transfer or flash write) that requires a comparatively long time, improvement of the write performance can be realized without using a high calculation performance.

The block management includes management of defective blocks, wear leveling, garbage collection (GC), and the like. The wear leveling is an operation of leveling the number of times of rewrite of each block (i.e., number of program/erase cycles).

GC is an operation of increasing the number of free blocks. The free block is indicative of a block including no valid data. In the GC, the controller 4 copies valid data in several blocks where the valid data and invalid data exist together to the other block (for example, a free block). The valid data is indicative of data associated with the certain logical address. For example, data referred to by the L2P table 31 (i.e., data linked to the logical address as the latest data) is valid data and may be read later by the host 2. The invalid data is indicative of data which is not associated with any logical addresses. The data which is not associated with any logical addresses is data which may not be read any more by the host 2. Then, the controller 4 updates the L2P table 31 and maps physical addresses of the copy destination to the logical addresses of copied valid data, respectively. A block which contains only invalid data after the valid data have been copied to the other block is released as a free block. The block can be therefore reused after an erase operation on this block is executed.

The controller 4 includes a host interface 11, a CPU 12-1, a CPU 12-2, a NAND interface 13, a DRAM interface 14, a direct memory access controller (DMAC) 15, an internal buffer 16, an ECC encoding/decoding unit 17, and the like. The host interface 11, the CPU 12-1, the CPU 12-2, the NAND interface 13, the DRAM interface 14, the direct memory access controller (DMAC) 15, the internal buffer 16, and the ECC encoding/decoding unit 17 are interconnected via a bus 10.

The host interface 11 is a host interface circuit configured to execute communication with the host 2. The host interface 11 may be, for example, a PCIe controller (i.e., an NVMe controller). Alternatively, when the SSD 3 is configured to be connected to the host 2 via Ethernet (registered trademark), the host interface 11 may be an NVMe over Fabrics (NVMeOF) controller.

The host interface 11 receives various commands from the host 2. These commands include various commands such as a write command, a read command, a de-allocation (unmap/trim) command, and the like.

The write command is a command (i.e., a write request) of writing the data to be written (i.e., write data) to the NAND flash memory 5. For example, the write command for stream write includes a logical address (i.e., start LBA) of the data to be written (i.e., write data), the length of the write data, a stream identifier (i.e., stream ID) indicative of a stream associated with the write data, a data pointer indicative of a position in a write buffer in the memory of the host 2 where the write data is stored, etc.

The read command is a command (i.e., read request) of reading the data from the NAND flash memory 5 and includes a logical address (i.e., start LBA) of the data to be read, the length of the data, a data pointer indicative of a position in a read buffer in the memory of the host 2 to which the data is to be transferred, etc.

The de-allocation (unmap/trim) command is a command to invalidate data corresponding to a certain logical address. The de-allocation (unmap/trim) command designates a logical address range (i.e., an LBA range) to be invalidated.

Each of the CPU 12-1 and CPU 12-2 is a processor configured to control the host interface 11, the NAND interface 13, and the DRAM interface 14. Each of the CPU 12-1 and CPU 12-2 loads a control program (i.e., firmware) from the NAND flash memory 5 or a ROM (not illustrated) into the DRAM 6 in response to power-on of the SSD 3, and executes the firmware and thus various processes. The firmware may be loaded onto an SRAM in the controller 4 (not illustrated). Each of the CPU 12-1 and CPU 12-2 can execute a command process for processing various commands from the host 2, and the like. Operations of each of the CPU 12-1 and CPU 12-2 can be controlled by the above-described firmware. Several or all parts of the command process may be executed by dedicated hardware in the controller 4. The command process for one command includes a plurality of processes. The processes may be executed separately by the CPU 12-1 and CPU 12-2 or executed by either of the CPU alone.

At least one of the CPU 12-1 and CPU 12-2 can function as a write control unit 21 and a read control unit 22. Several or all parts of each of the write control unit 21 and the read control unit 22 may also be implemented by dedicated hardware in the controller 4.

The write control unit 21 executes a process of writing the write data associated with the write command to the NAND flash memory 5, in response to the write command received from the host 2. The write control unit 21 supports the above-described stream write operation. The write control unit 21 can allocate a plurality of write destination blocks corresponding to a plurality of streams from a plurality of blocks of the NAND flash memory 5, and manage the allocated write destination blocks.

In some NAND flash memories, data written in one page of a plurality of pages in a block becomes readable after data is written to one or more pages subsequent to the page in order to reduce program disturbance. The timing at which data in each page becomes readable varies according to write methods applied to the NAND flash memories.

For example, in a triple-level cell (TLC)-flash memory capable of storing 3-bit data per memory cell, a lower page, a middle page, and an upper page are allocated to a group of memory cells connected to a word line WL0, a lower page, a middle page, and an upper page are allocated to a group of memory cells connected to a next word line WL1, a lower page, a middle page, and an upper page are allocated to a group of memory cells connected to a further next word line WL2, a lower page, a middle page, and an upper page are allocated to a group of memory cells connected to a further next word line WL3, and a lower page, a middle page, and an upper page are allocated to a group of memory cells connected to a last word line WL*n*. In the memory cells connected to each word line, data cannot be correctly read from each of the lower page and the middle page until the write operation to the upper page is completed.

In addition, in a NAND flash memory, the page write order indicative of the order of pages necessary to write data to each block is defined. For example, in a TLC flash memory, in order to suppress the influence of program disturbance, the page write order is determined such that a write operation is executed for adjacent several word lines alternately.

For example, the write operation is executed in the write order of a write to the lower page of the word line WL0, a write to the lower page of the word line WL1, a write to the middle page of the word line WL0, a write to the lower page of the word line WL2, a write to the middle page of the word line WL1, a write to the upper page of the word line WL0, a write to the lower page of the word line WL3, a write to the middle page of the word line WL2, and a write to the upper page of the word line WL1. Thus, data written in one page of a plurality of pages in a block becomes readable after data is written to several pages subsequent to the page.

In the present embodiment, the nonvolatile memory that includes a plurality of blocks each including a plurality of pages and enables read of the data written to one of the pages of each block to be executed after writing the data to one or more pages subsequent with the page, is used as the NAND flash memory 5.

The write control unit 21 is configured to write the data to the write destination blocks allocated from the blocks of the NAND flash memory 5. The data write to each of the write destination blocks is executed in the above-described page write order. The write control unit 21 receives each of the write commands and executes the write operation of writing the write data associated with each write command to the NAND flash memory 5. The write operation includes (1) an address allocation operation of allocating the physical address indicative of a storage location in the NAND flash memory 5 to which the write data is to be written, to the write data, (2) an L2P update operation of updating the L2P table 31 such that the physical address allocated to the write data is associated with the logical address of the write data, (3) a data transfer operation of transferring the write data from the write buffer in the memory of the host 2 to the controller 4, (4) a flash write operation (program operation) of writing the write data transferred from the write buffer in the memory of the host 2 to the write destination block, and the like.

In the present embodiment, in response to receiving a write command from the host 2, the write control unit 21 determines a physical address indicative of the physical storage location of the NAND flash memory 5 to which the write data associated with the write command is to be written (i.e., address allocating operation). The determined physical address includes a block address and an offset (in-block offset), the block address is indicative of a write destination block to which the write data is to be written, and the offset is indicative of the write destination location (i.e., a page address, and an in-page offset) in the write destination block to which the write data is to be written.

The write control unit 21 updates the L2P table 31 such that the determined physical address is associated with the logical address of the write data (i.e., L2P update operation). The write control unit 21 transfers the write data from the write buffer in the memory of the host 2 to the controller 4 (i.e., data transfer).

The data transfer from the write buffer in the memory of the host 2 to the controller 4 may be executed every time the write command is received or when the total size of the write data associated with a set of write commands belonging to a same stream reaches a minimum write size of the NAND flash memory 5. The minimum write size of the NAND flash memory 5 may be the page size, i.e., the size of one page (for example, 16K bytes). Alternatively, in a case where a NAND flash memory chip including two planes is used as the NAND flash memory 5, the write operations to two blocks selected from each of the two planes are often executed parallel. In this case, twice the page size (for example, 32K bytes) may be used as the minimum write size of the NAND flash memory 5.

After finishing the data transfer, the write control unit 21 writes the write data to the write destination location in the write destination block of the NAND flash memory 5, which is designated by the determined physical address (i.e., flash write).

The write control unit 21 may start updating the L2P table 31 before transfer of the write data is finished or before write of the NAND flash memory 5 is finished, such that the L2P update operation is executed in parallel with the data transfer or the flash write. Thus, the L2P update can be executed on the background of the process (i.e., data transfer or flash write) that requires a comparatively long time by making the start timing of the L2P update operation earlier, and improvement of the write performance can be realized without using a high calculation performance.

The read control unit 22 receives a read command from the host 2 and reads read target data designated by the received read command from the NAND flash memory 5, a first buffer in the SSD 3, or a write buffer in the memory of the host 2. The first buffer in the SSD 3 is a buffer for temporarily storing write data received from the host 2. A buffer 32 in the DRAM 6 can be used as the first buffer.

When the read target data designated by the read command received from the host 2 is readable from the read target block of a plurality of blocks of the NAND flash memory 5, the read control unit 22 reads the read target data from the read target block and transmits the read target data to the host 2. The read target block is a block having a block address which is represented by a physical address allocated to a logical address of the read target data.

In contrast, when the read target block is the block currently used as the write destination block and the physical storage location allocated to the logical address of the read target data is in an un-readable area of the write destination block, the read control unit 22 reads the read target data from the first buffer in the SSD 3 or the write buffer of the host 2, and transmits the read target data that is read from the first buffer or the write buffer of the host 2 to the host 2.

That is, in response to receiving the read command from the host 2, the read control unit 22 first acquires from the L2P table 31 a physical address of read target data designated by the read command. When the acquired physical address is indicative of a physical storage location that is not readable in the write destination location, the read control unit 22 reads the read target data from the buffer (i.e., the first buffer in the SSD 3 or the write buffer of the host 2). The data read from the buffer is executed, based on information indicative of a location in the buffer storing the data which is being written to or waiting for write to each physical address un-readable in the write destination block.

Thus, when the read target data that is designated by the read command is un-readable from the NAND flash memory 5, the read control unit 22 reads the read target data from the first buffer in the SSD 3 or the write buffer of the host 2. Therefore, even when the data which is being written to a certain write destination block or the data waiting for being written, which has not started being written to the write destination block, is required by the read command from the host 2, the data can be returned to the host 2, and improvement of performance of the data read can be thereby realized.

The NAND interface 13 is a memory control circuit configured to control the NAND flash memory 5 under the control of the CPU 12-1 or the CPU 12-2.

The DRAM interface 14 is a DRAM control circuit configured to control the DRAM 6 under the control of the CPU 12-1 or the CPU 12-2. Several parts of the storage area of the DRAM 6 may be used as the storage area for the L2P table 31 and the storage area for the buffer 32. In addition, the other parts of the storage area of the DRAM 6 may be used for storing a block management table 33 and a write destination block management table 34.

The DMAC 15 executes data transfer between the memory of the host 2 and the internal buffer 16 (or the buffer 32 of the DRAM 6) under the control of the CPU 12-1 or the CPU 12-2. The internal buffer 16 may be implemented by SRAM in the controller 4.

When data is to be written to the NAND flash memory 5, the ECC encoding/decoding unit 17 encodes the data (data to be written) (ECC encoding), thereby adding an error correction code (ECC) to the data as a redundant code. When data is read from the NAND flash memory 5, the ECC encoding/decoding unit 17 uses the ECC added to the read data to execute error correction of the data (ECC decoding).

Figure 5:
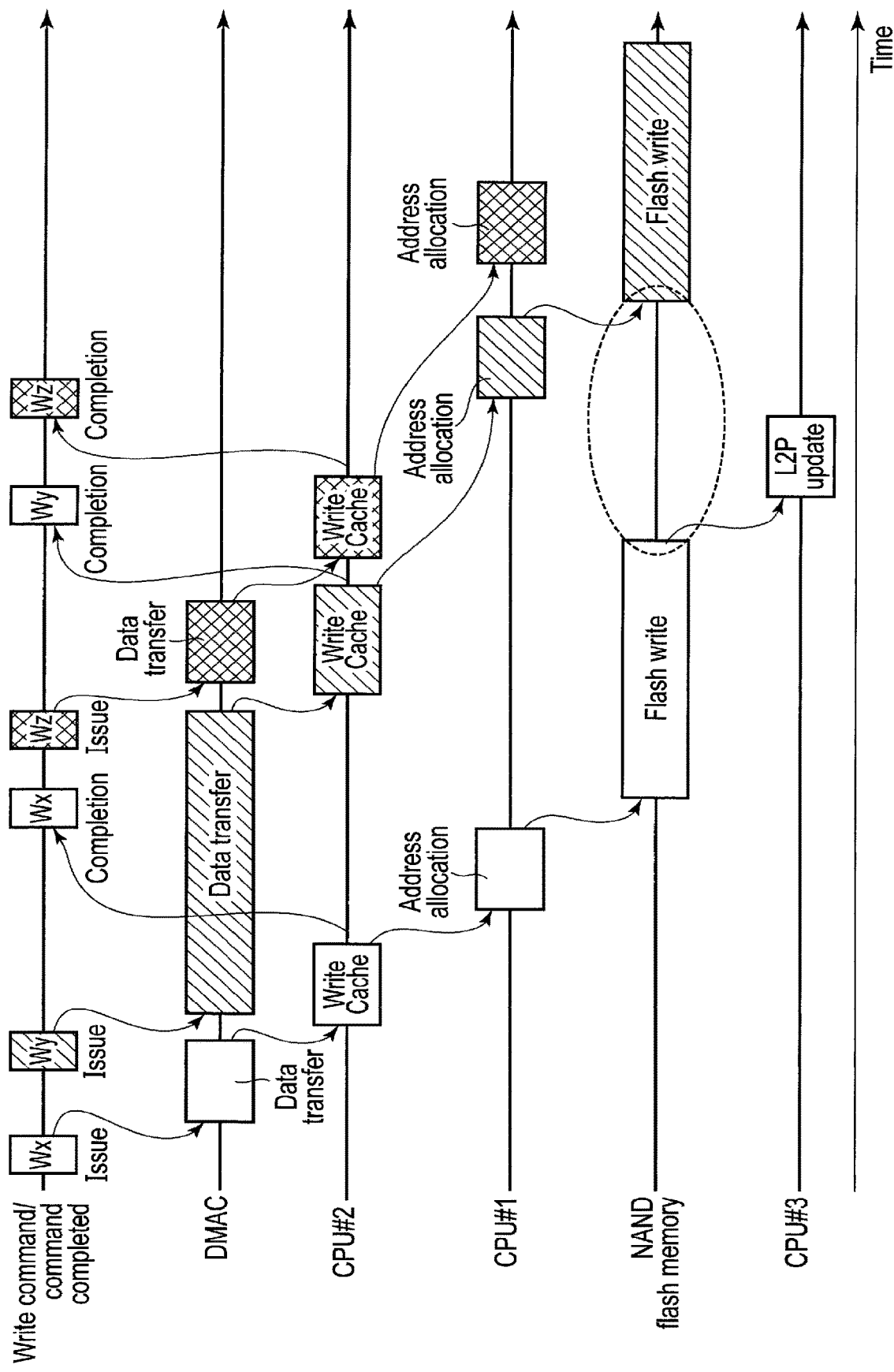
FIG. 5 is a chart illustrating an example of a write sequence of updating an address translation table after data write.

FIG. 5 illustrates an example of a write sequence according to a comparative example. In the write sequence according to the comparative example, the L2P table 31 is updated after writing the data.

In the write sequence according to the comparative example, when write command Wx is received from the host 2, the write data is first transferred from the write buffer of the host memory to the write cache in the SSD (i.e., data transfer). After the data transfer, the physical address indicative of the physical storage location in the NAND flash memory 5 to which the write data is to be stored is allocated to the write data (address allocation), and the write data is written to the NAND flash memory. Then, the L2P table 31 is updated after finishing the write to the NAND flash memory. In this case, in general, since the address allocation operation to the write data associated with a next write command Wy cannot be started until the update of the L2P table 31 is finished, the start timing of the flash write operation corresponding to the next write command Wy is often delayed. A high calculation performance enabling the L2P update to be executed at a high speed is considered necessary to prevent degradation of the write performance.

Figure 6:
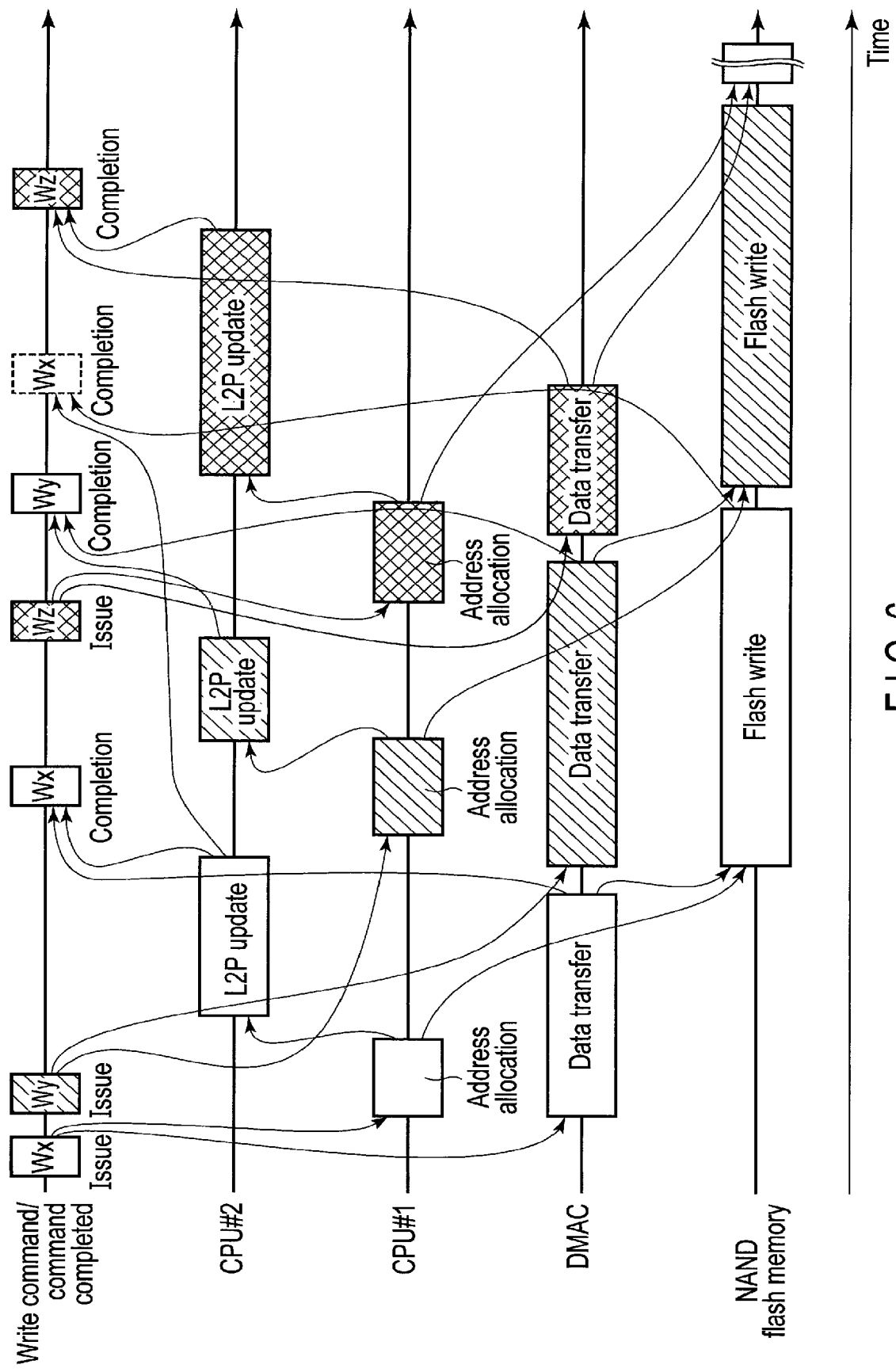
FIG. 6 is a chart illustrating a write sequence executed in the memory system according to the embodiment.

FIG. 6 illustrates a sequence of the write operation executed by the SSD 3.

When receiving write command Wx from the host 2, CPU #1 (for example, CPU 12-1) of the controller 4 determines the physical address (i.e., block address, page address, and in-page offset) indicative of the physical storage location in the NAND flash memory 5 where the write data associated with the write command Wx is to be stored, and allocates this physical address to the write data (address allocation operation). CPU #2 (for example, CPU 12-2) of the controller 4 updates the L2P table 31 such that the physical address is associated with the logical address designated by the write command Wx (L2P update).

The DMAC 15 transfers the write data associated with the write command Wx from the write buffer of the host memory to the controller 4 (i.e., data transfer). This data transfer may be started when the length of the write data associated with a set of received write commands including the same stream ID as that of the write command Wx reaches the minimum write size of the NAND flash memory 5. Then, the controller 4 writes the write data transferred from the write buffer of the host memory to the write destination location in the write destination block, which is designated by the determined physical address in the NAND flash memory 5 (flash write).

After completing both the L2P update of mapping the physical address to the logical address designated by the write command Wx and the transfer of the write data associated with the write command Wx, the controller 4 returns a response (i.e., completion) indicative of completion of the write command Wx to the host 2.

It should be noted that, after completing both the L2P update of mapping the physical address to the logical address designated by the write command Wx and the flash write of the write data associated with the write command Wx, the controller 4 may return a response (i.e., completion) indicative of completion of the write command Wx to the host 2.

In addition, the controller 4 may return, to the host 2, a response indicating that the write command Wx has been received when the L2P update is finished, and may thereby notify the host 2 that the update data written by the write command Wx is readable from the SSD 3.

The write command Wy and the write command Wz are processed similarly to the write command Wx.

The flowchart of FIG. 7 illustrates a procedure of the write operation executed by the SSD 3.

The controller 4 receives the write command from the host 2 (step S11). In response to receiving the write command, the controller 4 determines the physical address indicative of the physical storage location of the NAND flash memory 5 to which the write data associated with the received command is to be written, and allocates the determined physical address to the write data (step S12).

The controller 4 updates the L2P table 31 such that the determined physical address is associated with the logical address of the write data (step S13). The controller 4 transfers this write data from the write buffer in the memory of the host 2 to the internal buffer 16 (or the DRAM buffer 32) by using the DMAC 15 (step S14).

When the transfer of the write data from the write buffer in the memory of the host 2 to the internal buffer 16 (or the DRAM buffer 32) is finished (YES in step S15), the controller 4 writes the write data to the write destination location in the write destination block of the NAND flash memory 5, which is designated by the determined physical address (step S16).

FIG. 8 illustrates an example of a data structure of the block management table 33 stored in the DRAM 6.

The block management table 33 includes a plurality of areas corresponding to all blocks (in this example, block BLK1 to block BLKn) in the NAND flash memory 5, respectively. These blocks (BLK1 to BLKn) include a plurality of blocks (i.e., opened blocks; write destination blocks) to which data are being written, a plurality of blocks (i.e., closed blocks; active blocks) that are entirely filled with data and include valid data, a plurality of free blocks including no valid data, and the like.

Each of areas in the block management table 33 stores metadata with respect to the block corresponding to this area. For example, the metadata of the area corresponding to the block BLK1 includes un-readable pointer (URP) indicative of a minimum physical address of un-readable area in the block BLK1. The metadata of the area corresponding to the block BLK2 includes un-readable pointer (URP) indicative of a minimum physical address of un-readable area in the block BLK2. Similarly, the metadata of the area corresponding to the block BLKn includes un-readable pointer (URP) indicative of a minimum physical address of un-readable area in the block BLKn. The minimum physical address of un-readable area is also referred to un-readable minimum physical address.

Figure 9:
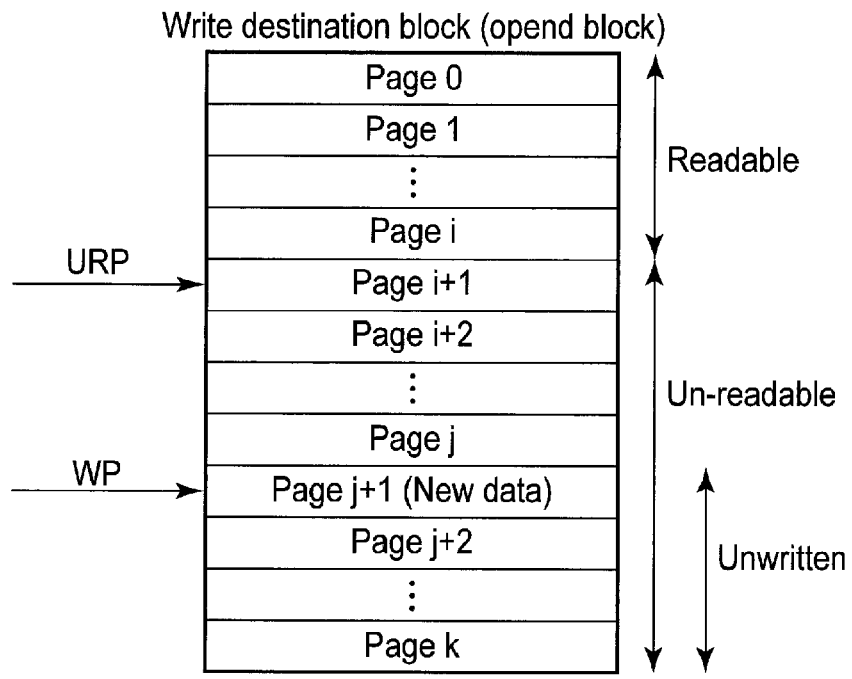
FIG. 9 is a diagram illustrating an un-readable pointer (URP) corresponding to each write destination block.

FIG. 9 is a diagram illustrating an un-readable pointer (URP) corresponding to each write destination block.

In each write destination block, two pointers, i.e., the un-readable pointer (URP) and the write pointer (WP) are managed. WP corresponding to a certain write destination block is indicative of the physical storage location (page address) in this write destination block to which data is to be next written. URP corresponding to a certain write destination block is indicative of the minimum physical address (i.e., minimum page address) of un-readable area in this write destination block as described above. FIG. 9 illustrates a case where the physical storage location where data is to be next written is page j+1 and the un-readable minimum physical address is i+1. A page range corresponding to page 0 to page i is a readable area where the data can be normally read from the write destination block, and a page range corresponding to page i+1 to page k is an un-readable area where the data cannot be normally read from the write destination block.

A page range corresponding to page i+1 to page j, of the un-readable area, is an area where data is being written, and a page range corresponding to page j+1 to page k is an unwritten area where writing of data is not started.

New data is written to the page designated by WP. When the data is written to the page designated by WP, URP is updated and WP is also updated.

Figure 10:
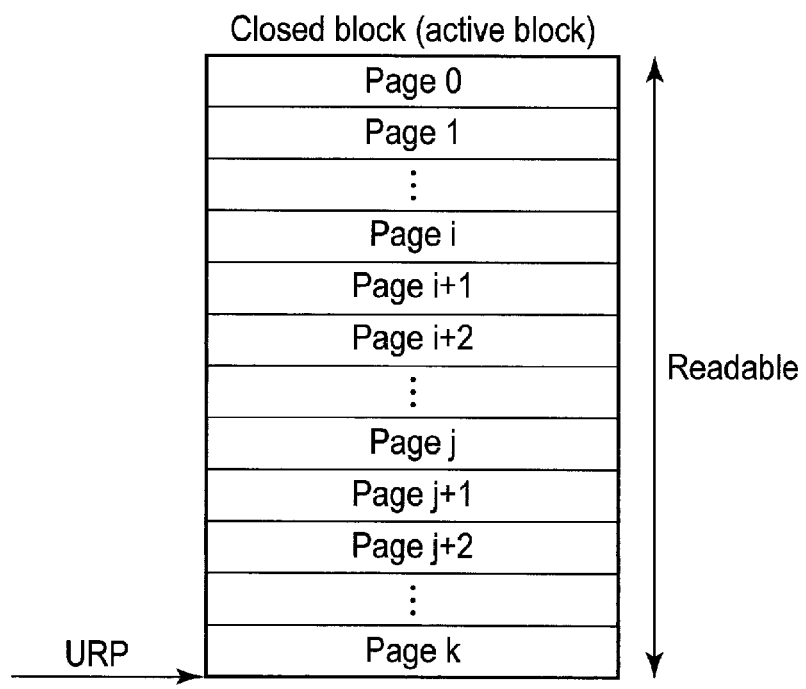
FIG. 10 is a diagram illustrating an un-readable pointer (URP) corresponding to each active block (i.e., closed block).

FIG. 10 is a diagram illustrating an un-readable pointer (URP) corresponding to each active block (i.e., closed block).

URP of any of active blocks is indicative of a value larger than the physical address (i.e., last page address in the block) of the block end.

The controller 4 acquires from the L2P table 31 a physical address allocated to the logical address of the read target data designated by the read command received from the host 2. The physical address includes a block address indicative of the read target block and an offset indicative of the read target location in this read target block. The offset is referred to as an in-block offset. This in-block offset may be represented by the page address and the in-page offset.

The controller 4 acquires from the block management table 33 URP corresponding to the read target block having the block address in the physical address acquired from the L2P table 31. The controller 4 can compare the offset (i.e., in-block offset) in the acquired physical address with URP of the read target block and can immediately determine whether the read target data is readable from the read target block or not, i.e., which of the readable area and the un-readable area of the read target block the physical address allocated to the logical address of the read target data belongs to. In this case, the controller 4 does not need to check whether the read target block is a block currently used as the write destination block or a closed block, and may compare the offset (i.e., the in-block offset) in the acquired physical address with URP of the read target block.

Figure 11:
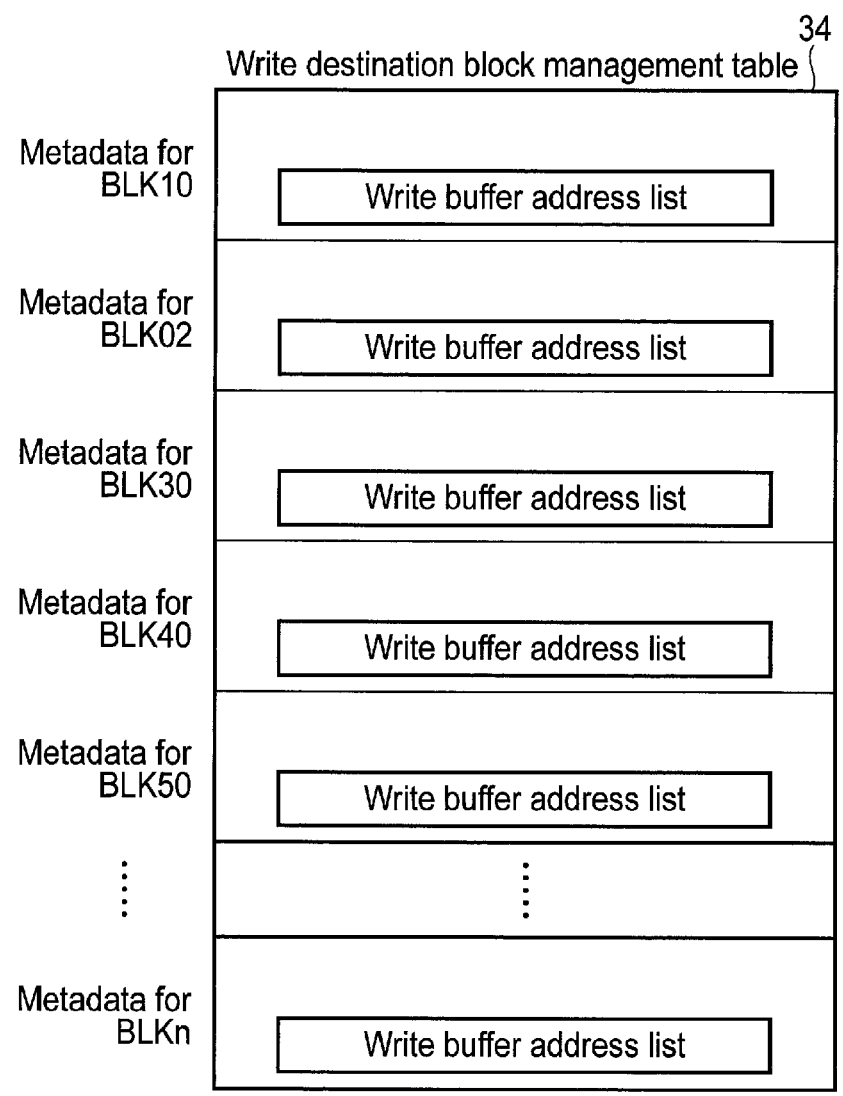
FIG. 11 is a diagram illustrating an example of a data structure of a write destination block management table used in the memory system according to the embodiment.

FIG. 11 illustrates an example of a data structure of the write destination block management table 34.

The write destination block management table 34 includes a plurality of areas corresponding to respective blocks (in this example, block BLK10, block BLK20, block BLK30, block BLK40, block BLK50, . . . block BLKn) currently used as the write destination blocks.

Each of areas in the write destination block management table 34 stores metadata with respect to the write destination block corresponding to this area. For example, the metadata of the area corresponding to the write destination block BLK10 includes a write buffer address list indicative of a list of the buffer addresses where the write data to be written to the un-readable area of the write destination block BLK10 are stored. Similarly, the metadata of the area corresponding to the write destination block BLKn includes a write buffer address list indicative of a list of the buffer addresses where the write data to be written to the un-readable area of the write destination block BLKn are stored.

A write buffer address list corresponding to a certain write destination block is buffer management information indicative of correspondence between each of physical addresses (for example, in-block offsets) of the un-readable area in this write destination block and each of locations in the buffer where the data which are being written to or waiting for being written to these physical addresses of the write destination block are stored.

In the read operation, when the physical address acquired from the L2P table 31 is indicative of the physical storage location which is not readable in the read target block, i,e., when the read target block is a block currently used as the write destination block and the read target physical storage location belongs to the un-readable area in the write destination block, the controller 4 acquires the location in the buffer where the read target data is stored, by referring to the information (buffer address list) indicative of the locations in the buffer where the data which is being written to or waiting for being written to each un-readable physical address in the write destination block are stored. Then, the controller 4 reads the read target data from the acquired location in the buffer.

Thus, not a process of searching the entire buffer for desired data based on the logical address designated by the read command, but a process of referring the only small table (buffer address list) associated with specific read target block (in this example, specific write destination block) having the block address allocated to this logical address is performed, and the location (buffer address) in the buffer where the read target data is stored can be thereby acquired with a good efficiency.

FIG. 12 illustrates an example of a write buffer address list in the write destination block management table 34.

In FIG. 12, a write buffer address list corresponding to the write destination block BLK10 is illustrated.

In the area in the write destination block management table 34 corresponding to the write destination block BLK10, buffer addresses where the write data to be written to the un-writable area of the write destination block BLK10 are present are stored. Each of the buffer addresses is indicative of the region in the buffer 32 in the DRAM 6 or the region in the write buffer 51 in the host memory. As regards the write data already transferred from the write buffer 51 in the host memory to the buffer 32 in the DRAM 6, the buffer address of the write data is indicative of the region in the buffer 32 in the DRAM 6. As regards the write data that is still not transferred from the write buffer 51 in the host memory to the buffer 32 in the DRAM 6, the buffer address of the write data is indicative of the region in the write buffer 51 in the host memory.

In the area in the write destination block management table 34 corresponding to the write destination block BLK10, buffer addresses are associated with respective physical addresses (PBA) in the un-writable area of the write destination block BLK10. For example, as regards the write data to be written to write page i+1, the buffer address of the write data is associated with the physical address (PBA) indicative of page i+1. In addition, as regards the write data to be written to write page j, the buffer address of the write data is associated with the physical address (PBA) indicative of page j.

When an unwritten area (for example, page j+1) of the write destination block BLK10 is already allocated as the write destination physical address, to the logical address of the write data associated with the write command received from the host 2, the buffer address of the write data to be written to page j+1 may also be included in the write buffer address list.

Figure 13:
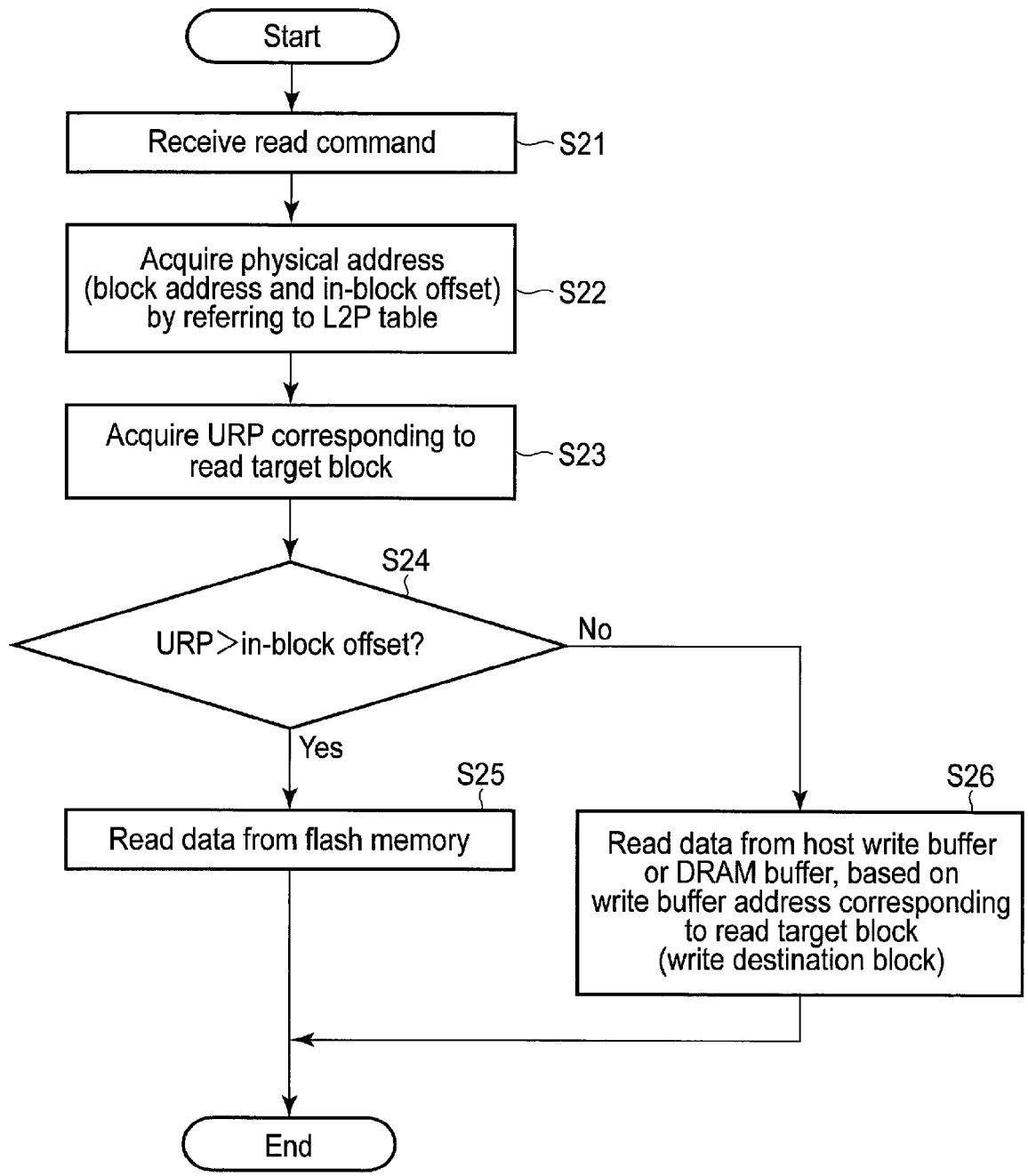
FIG. 13 is a flowchart illustrating a procedure of a read operation executed in the memory system according to the embodiment.

The flowchart of FIG. 13 illustrates a procedure of the read operation executed by the SSD 3.

The controller 4 receives the read command from the host 2 (step S21). With reference to the L2P table 31, the controller 4 acquires from the L2P table 31 the physical address (i.e., the block address and the in-block offset) corresponding to the logical address of the read target data designated by the received read command (step S22). The in-block offset may be represented by the page address and the in-page offset. The controller 4 acquires URP corresponding to the read target block (step S23).

The controller 4 determines whether or not the read target data is readable from the read target block having the block address included in the acquired physical address (step S24). In step S24, the controller 4 compares the in-block offset included in the acquired physical address with URP corresponding to the read target block.

In this case, when the in-block offset is smaller than URP (YES in step S24), the controller 4 can determine that the read target data is readable from the read target block. In contrast, when the block offset is larger than or equal to URP (NO in step S24), the controller 4 can determine that the read target data is not readable from the read target block, i.e., that the read target block is the write destination block and the read target physical storage location is in the un-readable area in the write destination block.

When the read target data is readable from the read target block (YES in step S24), the controller 4 reads the data from the read target physical storage location in the read target block, which is indicated by the acquired physical address, and returns the read data to the host 2 (step S25).

In contrast, when the read target data is not readable from the write target block (NO in step S24), i.e., when the read target block is the write destination block and the read target data is not readable from the read target block, the controller 4 acquires the buffer address associated with the acquired in-block offset from the write buffer address list corresponding to the read target block (write destination block), reads the read target data from the buffer (i.e., the write buffer 51 in the host memory or the buffer 32 in the DRAM 6) based on the acquired buffer address, and returns the read data to the host 2 (step S26).

Figure 14:
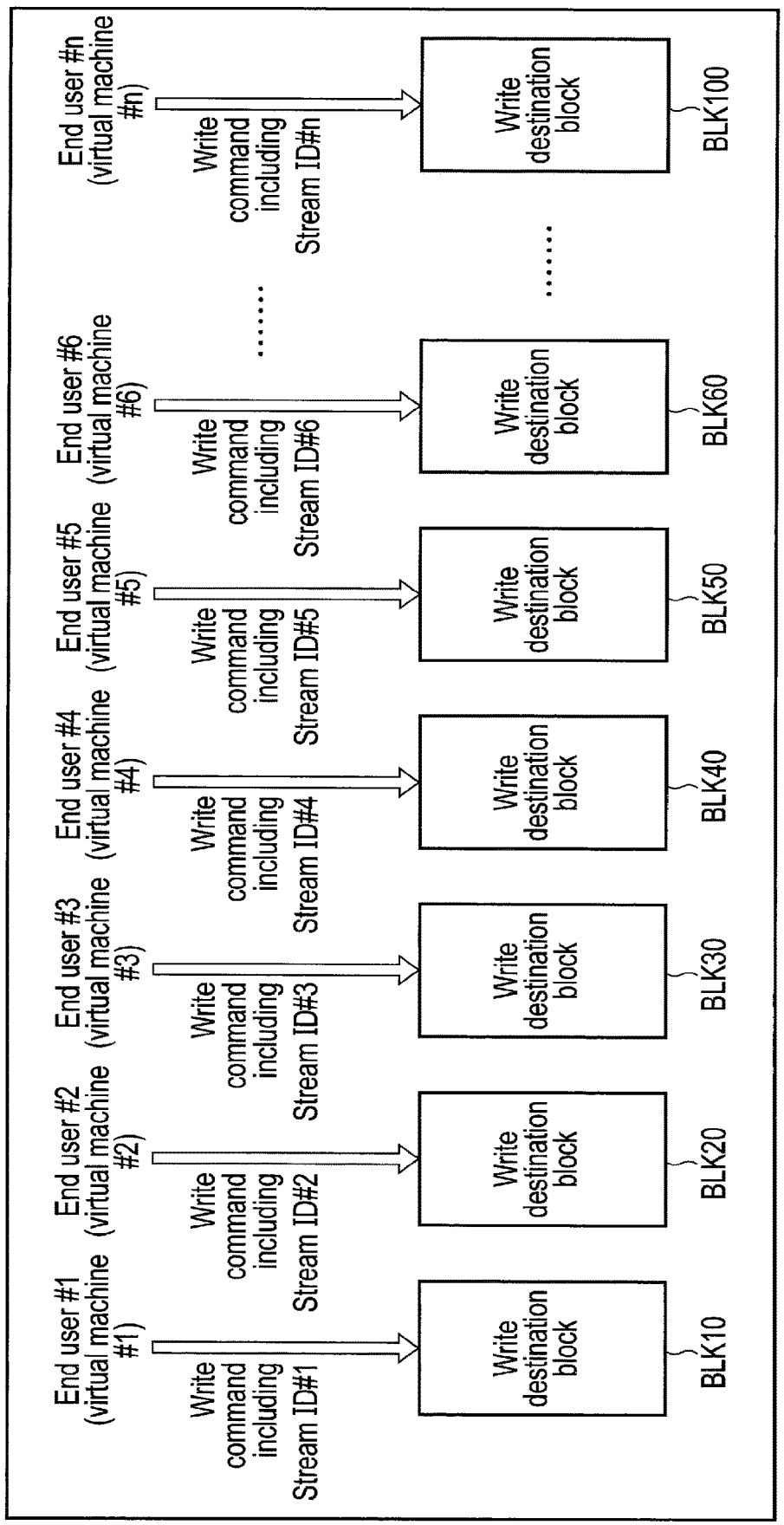
FIG. 14 is a block diagram illustrating a stream write operation which writes plural types of write data associated with a plurality of streams, to a plurality of write destination blocks corresponding to the plurality of streams, respectively.

FIG. 14 illustrates a stream write operation of writing a plurality of types of write data associated with a plurality of streams, to a plurality of write destination blocks corresponding to the streams, respectively.

In FIG. 14, the write destination block BLK10 is associated with the stream of stream ID #1, the write destination block BLK20 is associated with the stream of stream ID #2, the write destination block BLK30 is associated with the stream of stream ID #3, the write destination block BLK40 is associated with the stream of stream ID #4, the write destination block BLK50 is associated with the stream of stream ID #5, the write destination block BLK60 is associated with the stream of stream ID #6, and the write destination block BLK100 is associated with the stream of stream ID #n.

For example, I/O service (i.e., virtual machine #1) corresponding to end user #1 issues write commands each including the stream ID #1, I/O service (i.e., virtual machine #2) corresponding to end user #2 issues write commands each including the stream ID #2, and I/O service (i.e., virtual machine #n) corresponding to end user #n issues write commands each including the stream ID #n.

The write data associated with the write commands including the stream ID #1 are written to the write destination block BLK10, the write data associated with the write commands including the stream ID #2 are written to the write destination block BLK20, and the write data associated with the write commands including the stream ID #n are written to the write destination block BLK100.

FIG. 15 illustrates an operation of allocating the write destination blocks corresponding to the streams, from a group of free blocks.

In FIG. 15, only two streams, i.e., a stream (stream #1) of stream ID #1 and a stream (stream #2) of stream ID #2, are illustrated to simplify the illustration.

The states of the respective blocks in the NAND flash memory 5 are roughly classified into an active block which stores valid data and a free block which does not store valid data. Each block that is the active block is managed by a list referred to as an active block pool. In contrast, each block that is the free block is managed by a list referred to as a free block pool. An active block pool 101-1 is a list of blocks each storing the valid data associated with the stream #1. An active block pool 101-*n* is a list of blocks each storing the valid data associated with the stream #n. A free block pool 200 is a list of all the free blocks. The free blocks are shared by the streams.

When the controller 4 receives the write command including stream ID #1, the controller 4 determines whether or not the write destination block (opened block) for stream #1 is already allocated.

When the write destination block for stream #1 still is not allocated, the controller 4 allocates one of free blocks in the free block pool 200 as the write destination block for stream #1. In FIG. 15, an example that block BLK10 is allocated as the write destination block for stream #1 is illustrated. The controller 4 writes write data associated with the respective write commands including the stream ID #1 to the block BLK10. When the write destination block for stream #1 is already allocated, the controller 4 does not need to execute the operation of allocating the free block as the write destination block for stream #1.

When the whole write destination block (in this example, BLK 10) for stream #1 is filled with the write data from the host 2, the controller 4 manages (closes) the write destination block BLK10 by active block pool 101-1 and allocates a free block in a free block pool 200 as a new write destination block (opened block) for stream #1.

When all the valid data in a certain block in the active block pool 101-1 are invalidated by data update, de-allocation (unmap and trim), garbage collection, and the like, the controller 4 moves this block to the free block pool 200 to transition this block to a state of being reusable as a write destination block.

When the controller 4 receives the write command including stream ID fn, the controller 4 determines whether or not the write destination block (opened block) for stream #n is already allocated.

When the write destination block for stream #n still is not allocated, the controller 4 allocates one of free blocks in the free block pool 200 as the write destination block for stream #n. In FIG. 15, an example that block BLK100 is allocated as the write destination block for stream #n is illustrated. The controller 4 writes write data associated with the respective write commands including the stream ID #n to the block BLK100. When the write destination block for stream #n is already allocated, the controller 4 does not need to execute the operation of allocating the free block as the write destination block for stream #n.

When the whole write destination block (in this example, BLK 100) for stream #n is filled with the write data from the host 2, the controller 4 manages (i.e., closes) the write destination block BLK100 by active block pool 101-*n* and allocates a free block in the free block pool 200 as a new write destination block (opened block) for stream #n.

When all the valid data in a certain block in the active block pool 101-*n* are invalidated by data update, de-allocation (unmap and trim), garbage collection, and the like, the controller 4 moves this block to the free block pool 200 to transition the block to a state of being reusable as a write destination block.

FIG. 16 illustrates a write operation executed by using a plurality of buffer areas corresponding to the streams.

In FIG. 16, write buffer area WB #1, write buffer area WB #2, write buffer area WB #3, . . . write buffer area WB #n corresponding to the stream #1, the stream #2, the stream #3, . . . the stream #n respectively are prepared as first buffers in the SSD 3.

The write data associated with respective write commands including the stream ID #1 are transferred from the write buffer 51 in the memory of the host 2 to the write buffer area WB #1, and stored in the write buffer area WB #1. When the total size of the write data stored in the write buffer WB #1 reaches the minimum write size of the NAND flash memory 5, the write data are written to the write destination block BLK10.

As described above, the minimum write size of the NAND flash memory 5 may be the page size, i.e., the size of one page (for example, 16K bytes). Alternatively, in a case where a NAND flash memory including two planes is used as the NAND flash memory 5, twice the page size (for example, 32K bytes) may be used as the minimum write size of the NAND flash memory 5.

The minimum length of the write data designated by each write command is, for example, 4K bytes (or 512 bytes). The minimum write size of the NAND flash memory 5 is therefore larger than the minimum size of the write data designated by each write command.

The write data associated with respective write commands including the stream ID #2 are transferred from the write buffer 51 in the memory of the host 2 to the write buffer area WB #2, and stored in the write buffer area WB #2. When the total size of the write data stored in the write buffer WB #2 reaches the minimum write size of the NAND flash memory 5, the write data are written to the write destination block BLK20.

The write data associated with respective write commands including the stream ID #3 are transferred from the write buffer 51 in the memory of the host 2 to the write buffer area WB #3, and stored in the write buffer area WB #1. When the total size of the write data stored in the write buffer WB #3 reaches the minimum write size of the NAND flash memory 5, the write data are written to the write destination block BLK30.

Similarly, the write data associated with respective write commands including the stream ID #n are transferred from the write buffer 51 in the memory of the host 2 to the write buffer area WB #n, and stored in the write buffer area WB #n. When the total size of the write data stored in the write buffer WB #n reaches the minimum write size of the NAND flash memory 5, the write data are written to the write destination block BLK100.

In the configuration illustrated in FIG. 16, the write buffer having a large size including the write buffer area WB #1, write buffer area WB #2, write buffer area WB #3, . . . write buffer area WB #n corresponding to the stream #1, the stream #2, the stream #3, . . . the stream #n, respectively, is provided in the SSD 3.

FIG. 17 illustrates an example of the write operation for reducing the write buffer size necessary to be provided in the SSD 3.

Every time the controller 4 of the SSD 3 receives the write command from the host 2, the controller 4 stores the write command in a command queue 41. That is, the controller 4 classifies the received write commands into n+1 groups corresponding to streams #1 to #n by storing each of the received write commands in one of command queues 41-1 to 41-n corresponding to streams #1 to #n.

In this case, each write command including stream ID #1 is stored in the command queue 41-1, each write command including stream ID #2 is stored in the command queue 41-2, each write command including stream ID #3 is stored in the command queue 41-3, and each write command including stream ID #n is stored in the command queue 41-n.

The controller 4 determines whether or not the length of the write data associated with a set of write commands belonging to the same group reaches the minimum write size, by calculating the sum (i.e., data size) of the lengths designated by the respective write commands belonging to the same group.

For example, as regards the group corresponding to stream #1, the controller 4 calculates the sum of the lengths included in the respective write commands stored in the command queue 41-1. When the sum of the lengths included in the respective write commands stored in the command queue 41-1 reaches the minimum write size, the controller 4 determines that the length of the write data associated with the set of the write commands belonging to the group corresponding to stream #1 has reached the minimum write size.

Similarly, as regards the group corresponding to stream #2, the controller 4 calculates the sum of the lengths included in the respective write commands stored in the command queue 41-2. When the sum of the lengths included in the respective write commands stored in the command queue 41-2 reaches the minimum write size, the controller 4 determines that the length of the write data associated with the set of the write commands belonging to the group corresponding to stream #2 reaches the minimum write size.

When the length of the write data associated with a set of the write commands belonging to a certain group reaches the minimum write size, for example, when the length designated by each of the write commands belonging to the group corresponding to stream #2 reaches the minimum write size, the controller 4 transfers the write data of the minimum write size associated with stream #2 from the write buffer 51 in the host memory to the internal buffer 16. Then, the controller 4 writes the write data transferred to the internal buffer 16 to the write destination block BLK 20 corresponding to the stream #2. When the write data is written to the write destination block BLK 20, the write data in the internal buffer 16 becomes unnecessary.

Therefore, for example, when the sum of the lengths included in the respective write commands stored in the command queue 41-3 reaches the minimum write size then, the controller 4 can transfer the write data of the minimum write size associated with the set of the write commands belonging to the group corresponding to stream #3 from the write buffer 51 in the host memory to the internal buffer 16, and can write the write data transferred to the internal buffer 16, to the write destination block BLK 30 corresponding to stream #3.

Thus, in the write operation illustrated in FIG. 17, the controller 4 checks the length (size) of the write data corresponding to the received write command group, for each stream, and detects the stream where the size of the write data reaches the minimum write size of the NAND flash memory 5. Then, the write data of the minimum write size associated with the stream where the size of the write data reaches the minimum write size is transferred from the write buffer 51 in the host memory to the internal buffer 16. Write of the write data of the minimum write size transferred to the internal buffer 16 can be started immediately. The internal buffer 16 can be therefore shared by a plurality of streams. Therefore, when the write operation of FIG. 17 is employed, the stream write operation can be executed with a good efficiency by preparing the only internal buffer 16 of the minimum write size, even when the number of streams to be supported by the SSD 3 is increased.

FIG. 18 illustrates a configuration example of each of the host 2 and the SSD 3 in relation to the data write.

Use of the write operation of FIG. 17 is assumed here.

In the host 2, each write command is stored in a submission queue 71. Each write command includes LBA of the write data, the length of the write data, stream ID, and a data pointer indicative of a location in the write buffer 51 where the write data is stored. A response indicative of completion of each write command is stored in a completion queue 72.

The write data associated with each write command is stored in the write buffer 51 in the host memory. In the write buffer 51, a plurality of corresponding areas may be allocated to stream #1 to stream #n. In this case, the write data associated with stream #1 is stored in the area in the write buffer 51 corresponding to stream #1, the write data associated with stream #2 is stored in the area in the write buffer 51 corresponding to stream #2, and the write data associated with stream #n is stored in the area in the write buffer 51 corresponding to stream #n.

In the SSD 3, the write control unit 21 receives each of the write commands from the submission queue 71 of the host 2, and classifies the received write commands into a plurality of groups corresponding to streams #1 to #n by storing each of the received write commands in one of command queues 41-1 to 41-n. Each write command including stream ID #1 is stored in the command queue 41-1, each write command including stream ID #2 is stored in the command queue 41-2, and each write command including stream ID #n is stored in the command queue 41-n.

The write control unit 21 executes the address allocation operation of allocating the physical address (PBA) indicative of the storage location in the NAND flash memory 5 to which the write data associated with each received write command is to be written, to the write data. Furthermore, the write control unit 21 updates the L2P table 31 such that the physical address is associated with the logical address. This physical address may be represented by a block address, a page address, and an in-page offset.

In each command queue, LBA, length, PBA, and buffer address may be managed for each write command. PBA is indicative of a physical address (i.e., block address, page address, and in-page offset) allocated to the write data associated with the write command. The buffer address is indicative of a location in the write buffer 51 where the write data associated with the write command is stored. The location in the write buffer 51 is designated by a data pointer included in the write command.

When the write data is transferred from the write buffer 51 of the host memory to the buffer 32 (hereinafter referred to as a DRAM buffer 32) of the DRAM 6, a value of the buffer address is updated to a value indicative of the location in the DRAM buffer 32 where the write data is stored. For example, the write data associated with the write command which has spent a predetermined time after the reception of a certain write command may be transferred from the write buffer 51 of the host memory to the DRAM buffer 32.

In the DRAM buffer 32, a plurality of corresponding areas may be allocated to stream #1 to stream #n. In this case, the write data associated with stream #1 is transferred to the area in the DRAM buffer 32 corresponding to stream #1, the write data associated with stream #2 is transferred to the area in the DRAM buffer 32 corresponding to stream #2, and the write data associated with stream #n is transferred to the area in the DRAM buffer 32 corresponding to stream #n.

When the length of the write data associated with a set of the write commands belonging to a group corresponding to a certain stream reaches the minimum write size, the write control unit 21 transmits to the DMAC 15 a transfer request to transfer the write data of the minimum write size associated with the stream from the write buffer 51 in the host memory to the internal buffer 16. In response to receiving the transfer request, the DMAC 15 transfers the write data of the minimum write size associated with the stream from the write buffer 51 in the host memory to the internal buffer 16 by executing the DMA transfer. Then, the write control unit 21 transmits a program instruction to the NAND interface 13 and writes the write data of the minimum write size transferred to the internal buffer 16 to the write destination block in the NAND flash memory 5.

Basically, when updating the L2P table 31 is finished and the transfer of the write data is finished, or when updating the L2P table 31 is finished and the write of the write data to the NAND flash memory 5 is finished, the write control unit 21 returns to the host 2 a response indicative of completion of the write command corresponding to the write data. The response indicative of completion of each write command is input to the completion queue 72 as a buffer release request to allow the host 2 to release the corresponding write data. Since the response indicative of the completion includes an identifier of the write command, the host 2 can release the area in the write buffer 51 where the write data associated with the completed write command designated by the response indicative of the completion is stored.

In addition, after completing the transfer of the write data of the minimum write size to the internal buffer 16, the write control unit 21 may delete each of the write commands corresponding to the write data, from the command queue.

In addition, when a predetermined time has elapsed since receiving a certain write command belonging in a group corresponding to a certain stream, the write control unit 21 transfers the only write data associated with the write command from the write buffer 51 in the host memory to the DRAM buffer 32 as write data for the stream, by using the DMAC 15, and returns a response indicative of completion of this write command to the host 2 even if the length of the write data associated with a set of the write commands belonging to the group corresponding to this stream does not reach the minimum write size.

For example, when a predetermined time has elapsed since the reception of a write command including the stream ID #1 but the size of write data associated with a set of write commands stored in the command queue 41-1 does not reach the minimum write size, that is, when the time during which the write command is kept in the command queue 41-1 reaches the predetermined time, the write control unit 21 transfers only write data associated with the write command from the write buffer 51 in the host memory to the DRAM buffer 32 in order to prevent a timeout error of the write command from occurring. In this case, the write data may be transferred to the area for the stream #1 in the DRAM buffer 32. The write command is deleted from the command queue 41-1.

In the period during which the host 2 requests that a large amount of data be written, that is, the period during which the number of write commands of each stream received from the host 2 is relatively large, there is a high possibility that the length of write data associated with a set of write commands belonging to the group corresponding to each stream reaches the minimum write size before a predetermined time has elapsed since the reception of a write command. Thus, most of write data are transferred, not to the DRAM buffer 32, but to the internal buffer 16. A case where the time during which a write command is kept in a command queue reaches a predetermined time occurs when the number of write commands received from the host 2 is relatively small.

Therefore, traffic between the controller 4 and the DRAM 6 is not increased for transfer of the write data. Therefore, the band width between the controller 4 and the DRAM 6 can be mainly used for a process of updating the L2P table 31 and the process of updating the L2P table 31 can be executed with a good efficiency.

FIG. 19 illustrates a configuration example of each of the host 2 and the SSD 3 in relation to the data read.

When the read control unit 22 receives the read command from the submission queue 71 of the host 2, the read control unit 22 acquires the physical address (i.e., block address and in-block offset (page address and in-page offset)) indicative of the physical storage location in the NAND flash memory 5 allocated to the logical address of the read target data designated by this read command, from the L2P table 31, by referring to the L2P table 31 in the DRAM 6.

When the read target data is readable from the NAND flash memory 5, the read control unit 22 transmits a read instruction for reading the read target data to the NAND flash memory 5 via the NAND interface 13 and reads the read target data from the NAND flash memory 5. The read target data which is read may be temporarily stored in an internal read buffer 16' in the controller 4. The internal read buffer 16' may be implemented by SRAM in the controller 4, similarly to the internal buffer 16.

The read control unit 22 transfers the read target data from the internal read buffer 16' to the read buffer 52 in the host memory by using the DMAC 15. The location in the read buffer 52 where the read target data is to be transferred is designated by the data pointer included in the read command. Then, the read control unit 22 returns to the host 2 the response indicative of completion of the read command, and puts the response indicative of completion of the read command to the completion queue 72 of the host 2.

When the read target data is still not readable from the NAND flash memory 5, i.e., when the read target data is the data waiting for written, which still does not start being written, or the data which is being written, i.e., starts being written but cannot be normally read from the NAND flash memory 5, the read control unit 22 reads the read target data from the DRAM buffer 32 or the write buffer 51 in the host memory and returns the read target data to the host 2. When reading the read target data from the write buffer 51 in the host memory, the read control unit 22 first transfers the read target data from the write buffer 51 to the internal read buffer 16' by using the DMAC 15, and transfers the read target data from the internal read buffer 16' to the read buffer 52 in the host memory by using the DMAC 15. When reading the read target data from the DRAM buffer 32, the read control unit 22 reads the read target data from the DRAM buffer 32 to the internal read buffer 16', and transfers the read target data from the internal read buffer 16' to the read buffer 52 in the host memory by using the DMAC 15.

As described above, The controller 4 can manage a buffer address of data which is to be written to a block and has not become readable, for each block currently used as a write destination block, using the write destination block management table 34. A buffer address corresponding to data which has been transferred to the DRAM buffer 32 and has not become readable from the NAND flash memory 5 is indicative of the location of the data in the DRAM buffer 32. A buffer address corresponding to data which has not been transferred to the DRAM buffer 32 and has not become readable from the NAND flash memory 5 is indicative of the location of the data in the write buffer 51 in the host memory. Thus, on the basis of a buffer address corresponding to read target data which has not become readable from the NAND flash memory 5, the read control unit 22 can read the read target data from the DRAM buffer 32 or the write buffer 51 in the host memory, and can return the read target data, which has been read, to the host 2.

Therefore, the host 2 can receive desired data from the SSD 3 by merely executing a simple process of issuing each of the read commands to the SSD 3, without executing a process of selectively issuing the read request to the write buffer 51 and the read command to the SSD 3.

Figure 20:
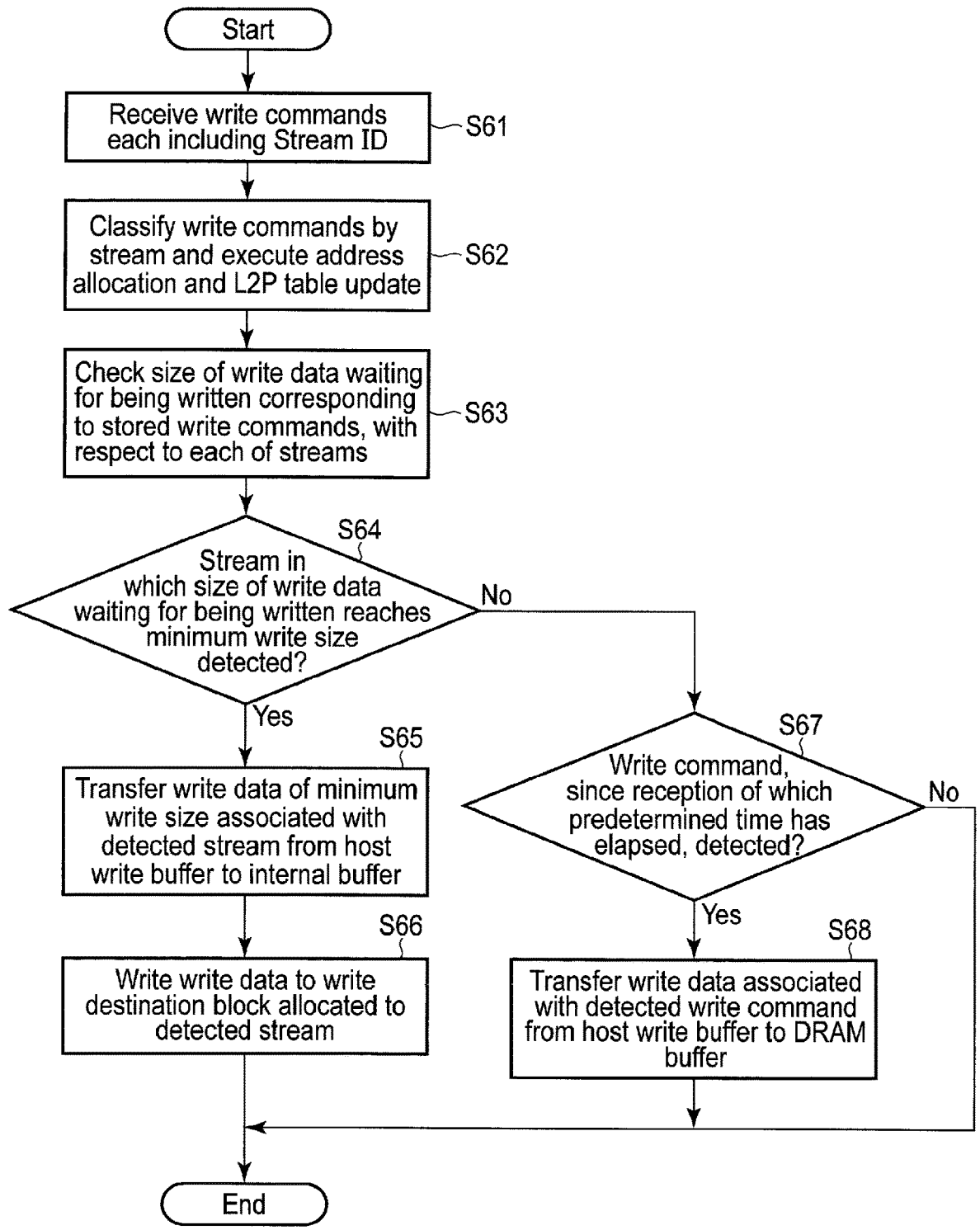
FIG. 20 is a flowchart illustrating a procedure of a write operation executed in the memory system according to the embodiment.

The flowchart of FIG. 20 illustrates a procedure of the write operation executed by the SSD 3.

The controller 4 receives the write commands each including a stream ID from the host 2 (step S61). The controller 4 classifies the received write commands by stream (step S62). In step S62, the controller 4 classifies the received write commands into a plurality of groups corresponding to streams #1 to #n by storing each of the received write commands in one of command queues 41-1 to 41-n. Thus, each write command including stream ID #1 is stored in the command queue 41-1, each write command including stream ID #2 is stored in the command queue 41-2, and each write command including stream ID #n is stored in the command queue 41-n. In step S62, the controller 4 further executes the address allocation operation and the L2P update operation for each of the received write commands.

The controller 4 checks the size of the write data waiting for being written, which corresponds to the stored write command, for each stream, and detects the stream where the size of the write data waiting for being written reaches the minimum write size (step S63). That is, in step S63, the controller 4 determines whether or not the length of the write data (i.e., the size of the write data waiting for being written) associated with a set of write commands belonging to the same group reaches the minimum write size, by calculating the sum of the lengths designated by the respective write commands belonging to the same group.

When the stream where the size of the write data waiting for being written reaches the minimum write size is detected (YES in step S64), the controller 4 transfers the write data of the minimum write size associated with the detected stream, from write buffer 51 in the host memory to the internal buffer 16 (step S65). Then, the controller 4 writes the write data transferred to the internal buffer 16 to the write destination block allocated for this stream (step S66).

When the stream where the size of the write data waiting for being written reaches the minimum write size is not detected (NO in step S64), the controller 4 detects whether there is a stream corresponding to a write command, since the reception of which a predetermined time has elapsed (step S67).

When it is detected that a predetermined time has elapsed since the reception of the write command corresponding to a certain stream (YES in step S67), the controller 4 transfers the write data associated with this write command from the write buffer 51 in the host memory to the DRAM buffer 32, as the write data for the stream (step S68). After transferring the write data associated with this write command from the write buffer 51 in the host memory to the DRAM buffer 32, the controller 4 deletes this write command from the command queue where this write command is stored.

The controller 4 returns a response indicative of completion of this write command to the host 2.

Thus, when a predetermined time elapses after the reception of the write command corresponding to a certain stream, a process of transferring the write data associated with this write command from the write buffer 51 in the host memory to the DRAM buffer 32 and a process of returning a response indicative of the completion of the write command to the host 2 are executed by the controller 4.

In addition, in a configuration of thus transferring the write data associated with the write command belonging to the group corresponding to a certain stream to the DRAM buffer 32, the controller 4 executes data transfer from the write buffer 51 in the host memory to the internal buffer 16 under a condition that the total length of (i) the length of the write data transferred to the DRAM buffer 32 and (ii) the length of the write data waiting for being written, associated with a set of the write commands belonging to the group corresponding to this stream reaches the minimum write size.

The flowchart of FIG. 21 illustrates a procedure of the write operation executed by the SSD 3 using the DRAM buffer 32.

The controller 4 receives the write commands each including the stream ID from the host 2 (step S71). The controller 4 classifies the received write commands by stream (step S72). In step S72, the controller 4 classifies the received write commands into a plurality of groups corresponding to streams #1 to #n by storing each of the received write commands in one of command queues 41-1 to 41-n. Thus, each write command including stream ID #1 is stored in the command queue 41-1, each write command including stream ID #2 is stored in the command queue 41-2, and each write command including stream ID #n is stored in the command queue 41-n. Furthermore, the controller 4 executes the address allocation operation and the L2P update operation for each of the received write commands.

The controller 4 checks, for each stream, the total size (i.e., total length) of the size of the write data waiting for being written, corresponding to the stored write commands and the size of the write data in the DRAM buffer 32, and detects the stream in which the total size reaches the minimum write size of the NAND flash memory 5 (step S73). That is, in step S73, the controller 4 determines, for each of the groups, whether the total length of (i) the length of the write data waiting for being written, associated with a set of the write commands in the command queue and (ii) the length of the write data in the DRAM buffer 32 reaches the minimum write size.

When detecting the stream where the total length of the length of the write data waiting for being written, associated with a set of the write commands in the command queue and the length of the write data in the DRAM buffer 32 reaches the minimum write size (YES in step S74), the controller 4 transfers the write data for the detected stream from the DRAM buffer 32 to the internal buffer 16 (step S75). The controller 4 transfers the write data associated with the detected stream from the write buffer 51 in the host memory to the internal buffer 16 (step S76). Then, the controller 4 writes the write data transferred from the write buffer 51 in the host memory to the internal buffer 16 to the write destination block allocated for this stream, together with the write data transferred from the DRAM buffer 32 to the internal buffer 16 (step S77).

When the stream where the total length of the length of the write data waiting for being written, associated with a set of the write commands in the command queue and the length of the write data in the DRAM buffer 32 reaches the minimum write size is not detected (NO in step S74), the controller 4 executes the processes in steps S67 and S68 in FIG. 20.

That is, the controller 4 detects whether there is a write command, since the reception of which a predetermined time has elapsed (step S67). When it is detected that the predetermined time has elapsed since the reception of a write command corresponding to a stream (YES in step S67), the controller 4 transfers write data associated with the write command from the write buffer 51 in the host memory to the DRAM buffer 32 as write data for the stream (step S68). After transferring the write data associated with this write command from the write buffer 51 in the host memory to the DRAM buffer 32, the controller 4 deletes this write command from the command queue where this write command has been stored. The controller 4 returns a response indicative of completion of this write command to the host 2.

As described above, according to the embodiment, updating the L2P table 31 is started before transfer of the write data is finished or before write of the write data to NAND flash memory 5 is finished. Thus, the L2P update can be executed on the background of the process (i.e., data transfer or flash write) that requires a comparatively long time by making the start timing of the L2P update operation earlier. Therefore, improvement of the write performance can be realized without preparing a high calculating ability to enable the L2P update to be executed at a high speed, as compared with executing the L2P update after flash write.

In addition, in the read operation, when the physical address acquired from the L2P table 31 is indicative of a physical storage location that is not readable in the write destination block, the read target data is read from the buffer (i.e., the first buffer in the SSD 3 or the write buffer of the host 2). The data read from the buffer is executed based on information indicative of a location in the buffer where data which is being written to or waiting for being written to each physical address not readable in the write destination block is stored.

Thus, the write performance can be improved; the data read from the buffer can also be executed by using the physical address acquired from the L2P table 31, by making the start timing of the L2P update earlier.

Therefore, even when the data that is being written to a certain write destination block or the write data waiting for being written, which has not started being written to the write destination block is required by the read command from the host 2, the data can be returned to the host 2, and improvement of performance of the data read can be thereby realized.

In addition, in the embodiment, the controller 4 can compare the offset (i.e., in-block offset) in the physical address acquired from the L2P table 31 with URP of the read target block and can immediately determine whether or not the read target data is readable from the read target block, i.e., which of the readable area and the un-readable area of the read target block the physical address allocated to the logical address of the read target data belongs to. In this case, the controller 4 does not need to check whether the read target block is a block currently used as the write destination block or a closed block, and may compare the offset (i.e., the block offset) in the acquired physical address with URP of the read target block.

In the present embodiment, the NAND flash memory has been illustrated as a nonvolatile memory. However, the functions of the present embodiment are also applicable to various other nonvolatile memories such as a magnetoresistive random access memory (MRAM), a phase change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, comprising:
 a nonvolatile memory including a plurality of blocks each including a plurality of pages; and
 a controller electrically connected to the nonvolatile memory and configured to control the nonvolatile memory, wherein
 the controller is configured to:
 in response to receiving a first write command from the host, determine a first physical address indicative of a physical storage location of the nonvolatile memory to which first write data associated with the first write command is to be written, and update an address translation table such that the first physical address is associated with a logical address of the first write data; and
 transfer the first write data from a write buffer in a memory of the host to the controller, and write the first write data to a write destination location in a first write destination block of the nonvolatile memory, which is designated by the first physical address, the controller is configured to start updating the address translation table before the transfer of the first write data is finished or before the write of the first write data to the nonvolatile memory is finished.

2. The memory system of claim 1, wherein
the nonvolatile memory is configured to enable read of data written to one page of a plurality of pages in each block to be executed after writing data to one or more pages subsequent with the page,
the controller is configured to:
in response to receiving a read command from the host, acquire a second physical address corresponding to a logical address of read target data designated by the read command from the address translation table; and
when the second physical address is indicative of a physical storage location which is not readable in the first write destination block, read the read target data from a buffer, based on information indicative of a location in the buffer where data which is being written to or waiting for being written to each physical address not readable in the first write destination block is stored, and
the buffer is a first buffer in the memory system or the write buffer of the host.

3. The memory system of claim 1, wherein
the nonvolatile memory is configured to enable read of data written to one page of a plurality of pages in each block to be executed after writing data to one or more pages subsequent with the page, and
the controller is configured to:
manage, with respect to each of a plurality of write destination blocks allocated from the plurality of blocks, a pointer indicative of a minimum physical address of an un-readable area from which data is un-readable, and manage, with respect to each of blocks where data are already written to all pages, a physical address larger than a physical address of a block end as the pointer;
acquire a second physical address corresponding to a logical address of read target data designated by the read command from the address translation table, the second physical address including a block address indicative of a read target block and an offset indicative of a read target location in the read target block; and
read the read target data from the read target block when the offset is smaller than a value of a pointer corresponding to the read target block, and read the read target data from a buffer when the offset is larger than or equal to the value of the pointer corresponding to the read target block, the buffer being a first buffer in the memory system or the write buffer of the host.

4. The memory system of claim 3, wherein
the controller is configured to:
manage, with respect to each of the write destination blocks, buffer management information indicative of correspondence between each of physical addresses of an un-readable area and each of locations in the buffer where data which are being written to or waiting for being written to the physical address are stored;
acquire a location in the buffer where the read target data is stored, by referring to buffer management information corresponding to the read target block; and
read the read target data from the acquired location in the buffer.

5. The memory system of claim 1, wherein
the controller is configured to return a response indicative of completion of the first write command to the host when updating the address translation table is finished and when transfer of the first write data is finished, or when updating the address translation table is finished and when write of the first write data to the nonvolatile memory is finished.

6. The memory system of claim 1, wherein
the controller is configured to return, to the host, a response indicating that the first write command is received when updating the address translation table is finished.

7. A method of controlling a memory system including a nonvolatile memory including a plurality of blocks each including a plurality of pages, the method comprising:
in response to receiving a first write command from a host, determining a first physical address indicative of a physical storage location of the nonvolatile memory to which first write data associated with the first write command is to be written, and updating an address translation table such that the first physical address is associated with a logical address of the first write data;
transferring the first write data from a write buffer in a memory of the host to the controller; and
writing the first write data to a write destination location in a first write destination block of the nonvolatile memory, which is designated by the first physical address, wherein
the updating the address translation table is started before the transfer of the first write data is finished or before the writing of the first write data to the nonvolatile memory is finished.

8. The method of claim 7, wherein
the nonvolatile memory is configured to enable read of data written to one page of a plurality of pages in each block to be executed after writing data to one or more pages subsequent with the page,
the method further comprises:
in response to receiving a read command from the host, acquiring a second physical address corresponding to a logical address of read target data designated by the read command from the address translation table; and
when the second physical address is indicative of a physical storage location which is not readable in the first write destination block, reading the read target data from a buffer, based on information indicative of a location in the buffer where data which is being written to or waiting for being written to each physical address not readable in the first write destination block is stored, and
the buffer is a first buffer in the memory system or the write buffer of the host.

9. The method of claim 7, wherein
the nonvolatile memory is configured to enable read of data written to one page of a plurality of pages in each block to be executed after writing data to one or more pages subsequent with the page, and
the method further comprising:
managing, with respect to each of a plurality of write destination blocks allocated from the plurality of blocks, a pointer indicative of a minimum physical address of an un-readable area from which data is un-readable, and manage, with respect to each of blocks where data are already written to all pages, a physical address larger than a physical address of a block end as the pointer;
acquiring a second physical address corresponding to a logical address of read target data designated by the read command from the address translation table, the second physical address including a block address indicative of a read target block and an offset indicative of a read target location in the read target block; and reading the read target data from the read target block when the offset is smaller than a value of a pointer corresponding to the read target block, and reading the read target data from a buffer when the offset is larger than or equal to the value of the pointer corresponding to the read target block, the buffer being a first buffer in the memory system or the write buffer of the host.

10. The method of claim 9, further comprising:

managing, with respect to each of the write destination blocks, buffer management information indicative of correspondence between each of physical addresses of an un-readable area and each of locations in the buffer where data which are being written to or waiting for being written to the physical address are stored, wherein the reading the read target data from the buffer comprises acquiring a location in the buffer where the read target data is stored, by referring to buffer management information corresponding to the read target block, and reading the read target data from the acquired location in the buffer.

11. The method of claim 7, further comprising:

returning a response indicative of completion of the first write command to the host when updating the address translation table is finished and when transfer of the first write data is finished, or when updating the address translation table is finished and when write of the first write data to the nonvolatile memory is finished.

12. The method of claim 7, further comprising:

returning, to the host, a response indicating that the first write command is received when updating the address translation table is finished.

* * * * *